(12) United States Patent
Nagarajan et al.

(10) Patent No.: US 12,616,043 B2
(45) Date of Patent: Apr. 28, 2026

(54) PACKAGE COMPRISING INTEGRATED DEVICES WITH INNER AND OUTER SOLDER INTERCONNECTS

(71) Applicant: QUALCOMM Incorporated, San Diego, CA (US)

(72) Inventors: Mahalingam Nagarajan, San Diego, CA (US); Vaishnav Srinivas, Oceanside, CA (US); Nitin Juneja, Fremont, CA (US); Christophe Avoinne, San Diego, CA (US); Xavier Loic Leloup, San Diego, CA (US); Michael David Jager, Camberley (GB); Charles David Paynter, Encinitas, CA (US); Joon Young Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 746 days.

(21) Appl. No.: 17/877,156

(22) Filed: Jul. 29, 2022

(65) Prior Publication Data

US 2024/0038672 A1 Feb. 1, 2024

(51) Int. Cl.
*H01L 23/538* (2006.01)
*H01L 23/00* (2006.01)
*H01L 25/065* (2023.01)

(52) U.S. Cl.
CPC .......... *H01L 23/5386* (2013.01); *H01L 24/14* (2013.01); *H01L 25/0655* (2013.01);
(Continued)

(58) Field of Classification Search
CPC . H01L 25/0655; H01L 25/072; H01L 25/115; H01L 23/49822; H01L 23/50;
(Continued)

(56) References Cited

U.S. PATENT DOCUMENTS 7,446,398 B2 * 11/2008 Niu ................... H01L 23/49838
361/755
10,923,429 B2 * 2/2021 Braunisch ............... H01L 24/14
(Continued)

OTHER PUBLICATIONS

International Search Report and Written Opinion—PCT/US2023/070337—ISA/EPO—Nov. 9, 2023.

*Primary Examiner* — Wael M Fahmy
*Assistant Examiner* — Aneesa Riaz Baig
(74) *Attorney, Agent, or Firm* — Loza & Loza, LLP

(57) ABSTRACT

A package comprising a substrate comprising at least one dielectric layer and a plurality of interconnects; a first integrated device coupled to the substrate through a first plurality of solder interconnects, wherein the first plurality of solder interconnects includes a first plurality of inner solder interconnects and a first plurality of perimeter solder interconnects; and a second integrated device coupled to the substrate through a second plurality of solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects.

10 Claims, 14 Drawing Sheets

PLAN VIEW

(52) U.S. Cl.
  CPC .............. *H01L 24/16* (2013.01); *H01L 24/81*
      (2013.01); *H01L 2224/14132* (2013.01); *H01L*
      *2224/16227* (2013.01); *H01L 2224/81815*
      (2013.01)

(58) Field of Classification Search
  CPC ... H01L 23/528; H01L 23/58; H01L 23/5386;
      H01L 23/49816; H01L 23/49838; H01L
      24/14; H01L 2924/381; H01L 2924/3841;
      H01L 24/82; H01L 24/18; H01L 24/19;
      H01L 24/20; H01L 24/16; H01L 24/17;
      H01L 23/3128; H01L 2924/15311; H01L
      2924/15321; H01L 2924/15331; H01L
      2924/1421; H01L 2224/48137; H01L
      2224/14131–14132
  See application file for complete search history.

(56) References Cited

U.S. PATENT DOCUMENTS

| | | | | |
|---|---|---|---|---|
| 11,410,894 | B2 * | 8/2022 | Arvin | G06F 3/002 |
| 11,557,557 | B2 * | 1/2023 | Sun | H01L 24/06 |
| 2008/0029876 | A1 * | 2/2008 | Niu | H01L 24/81 |
| | | | | 257/E23.021 |
| 2012/0261838 | A1 * | 10/2012 | Braunisch | H01L 24/73 |
| | | | | 257/E21.511 |
| 2014/0217579 | A1 * | 8/2014 | Ganesan | H01L 24/16 |
| | | | | 257/737 |
| 2015/0048521 | A1 * | 2/2015 | Kwon | H01L 25/105 |
| | | | | 257/777 |
| 2018/0175001 | A1 * | 6/2018 | Pyo | H01L 25/50 |
| 2018/0182696 | A1 * | 6/2018 | Ganesan | H01L 23/50 |
| 2019/0157227 | A1 * | 5/2019 | Fillion | H01L 23/5389 |
| 2019/0198447 | A1 * | 6/2019 | Aleksov | H01L 23/00 |
| 2019/0229058 | A1 * | 7/2019 | Qian | H01L 23/528 |
| 2019/0348360 | A1 * | 11/2019 | Kim | H01L 23/50 |
| 2020/0211965 | A1 * | 7/2020 | Wu | H01L 25/065 |
| 2022/0051989 | A1 * | 2/2022 | Agarwal | H01L 24/20 |
| 2022/0102280 | A1 * | 3/2022 | Dabral | H01L 25/50 |
| 2022/0199517 | A1 * | 6/2022 | Dabral | H01L 23/522 |
| 2022/0285280 | A1 * | 9/2022 | Zhou | H01L 24/06 |
| 2023/0097624 | A1 * | 3/2023 | McElhinny | H01L 24/14 |
| | | | | 257/737 |
| 2023/0154892 | A1 * | 5/2023 | Tu | H01L 24/17 |
| | | | | 257/668 |
| 2023/0282585 | A1 * | 9/2023 | Kang | H01L 21/4857 |
| | | | | 257/776 |
| 2023/0307341 | A1 * | 9/2023 | Brun | H01L 21/486 |

* cited by examiner

PLAN VIEW

*PLAN VIEW*

CROSS SECTIONAL PROFILE VIEW

PLAN VIEW

PLAN VIEW

PLAN VIEW

*PLAN VIEW*

CROSS SECTIONAL PROFILE VIEW

1000

PROVIDE A SUBSTRATE — 1005

COUPLE A FIRST INTEGRATED DEVICE AND A SECOND INTEGRATED DEVICE TO THE SUBSTRATE THROUGH A PLURALITY OF SOLDER INTERCONNECTS — 1010

COUPLE SOLDER INTERCONNECTS TO THE SUBSTRATE — 1015

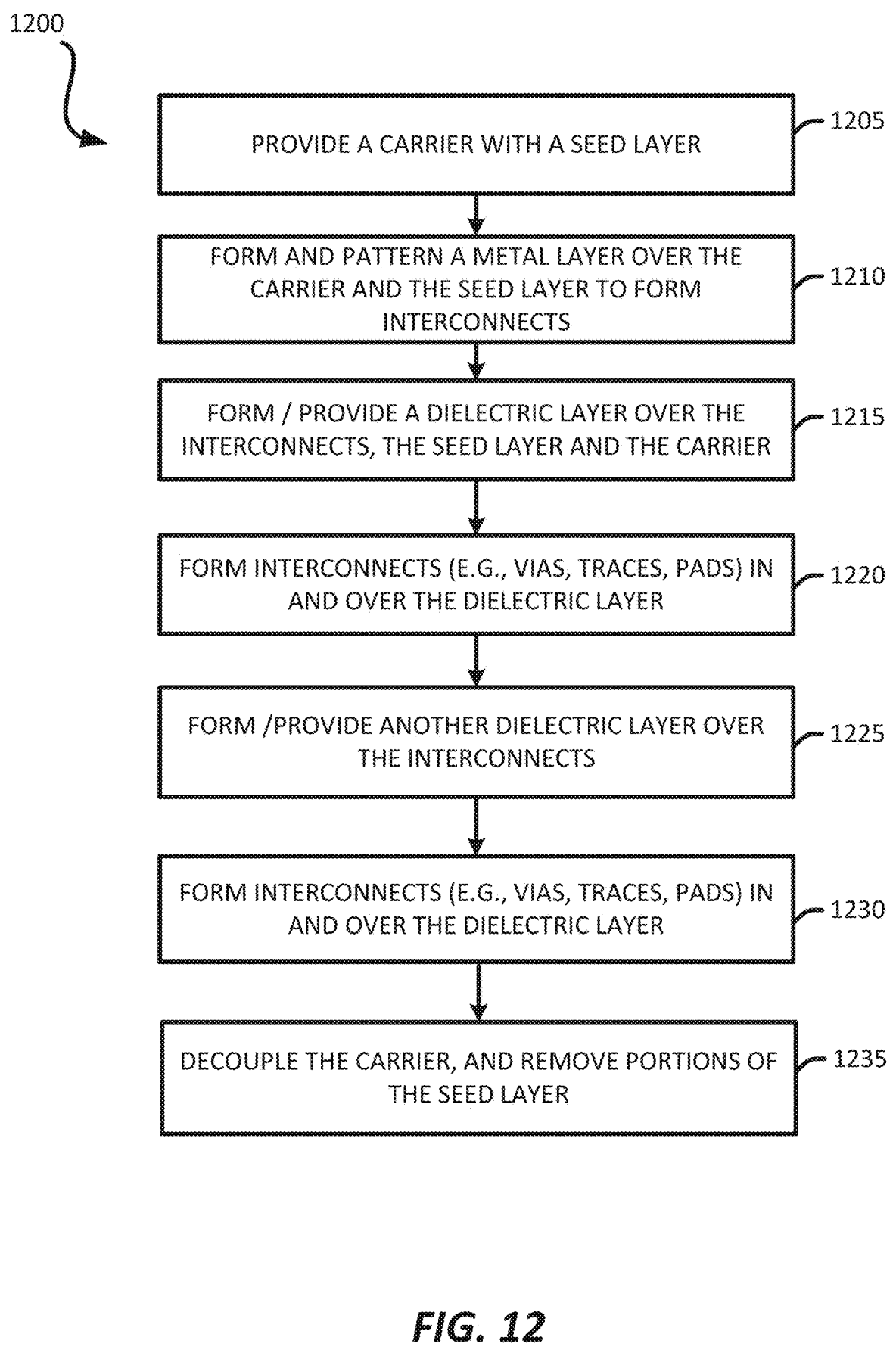

1200

PROVIDE A CARRIER WITH A SEED LAYER ——— 1205

FORM AND PATTERN A METAL LAYER OVER THE CARRIER AND THE SEED LAYER TO FORM INTERCONNECTS ——— 1210

FORM / PROVIDE A DIELECTRIC LAYER OVER THE INTERCONNECTS, THE SEED LAYER AND THE CARRIER ——— 1215

FORM INTERCONNECTS (E.G., VIAS, TRACES, PADS) IN AND OVER THE DIELECTRIC LAYER ——— 1220

FORM /PROVIDE ANOTHER DIELECTRIC LAYER OVER THE INTERCONNECTS ——— 1225

FORM INTERCONNECTS (E.G., VIAS, TRACES, PADS) IN AND OVER THE DIELECTRIC LAYER ——— 1230

DECOUPLE THE CARRIER, AND REMOVE PORTIONS OF THE SEED LAYER ——— 1235

*FIG. 12*

PACKAGE COMPRISING INTEGRATED DEVICES WITH INNER AND OUTER SOLDER INTERCONNECTS

FIELD

Various features relate to packages with substrates and integrated devices.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages with substrates and integrated devices.

One example provides a package comprising a substrate comprising at least one dielectric layer and a plurality of interconnects; a first integrated device coupled to the substrate through a first plurality of solder interconnects, wherein the first plurality of solder interconnects include a first plurality of inner solder interconnects and a first plurality of perimeter solder interconnects; and a second integrated device coupled to the substrate through a second plurality of solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects.

Another example provides a device that includes a substrate comprising at least one dielectric layer and a plurality of interconnects; a first integrated device coupled to the substrate through a first plurality of solder interconnects, wherein the first plurality of solder interconnects include a first plurality of inner solder interconnects and a first plurality of perimeter solder interconnects; and a second integrated device coupled to the substrate through a second plurality of solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates an exemplary flow chart of a method for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate comprising at least one dielectric layer and a plurality of interconnects; a first integrated device coupled to the substrate through a first plurality of solder interconnects, wherein the first plurality of solder interconnects include a first plurality of inner solder interconnects and a first plurality of perimeter solder interconnects; and a second integrated device coupled to the substrate through a second plurality of solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects. As will be further described below, the configuration of the package helps improve die to die signal speed and latency. The package is configured to help reduce route congestion in the integrated device by positioning more of the routes between integrated devices, in the substrate of the package.

Exemplary Packages Comprising a Substrate and Integrated Devices

Figure 1:
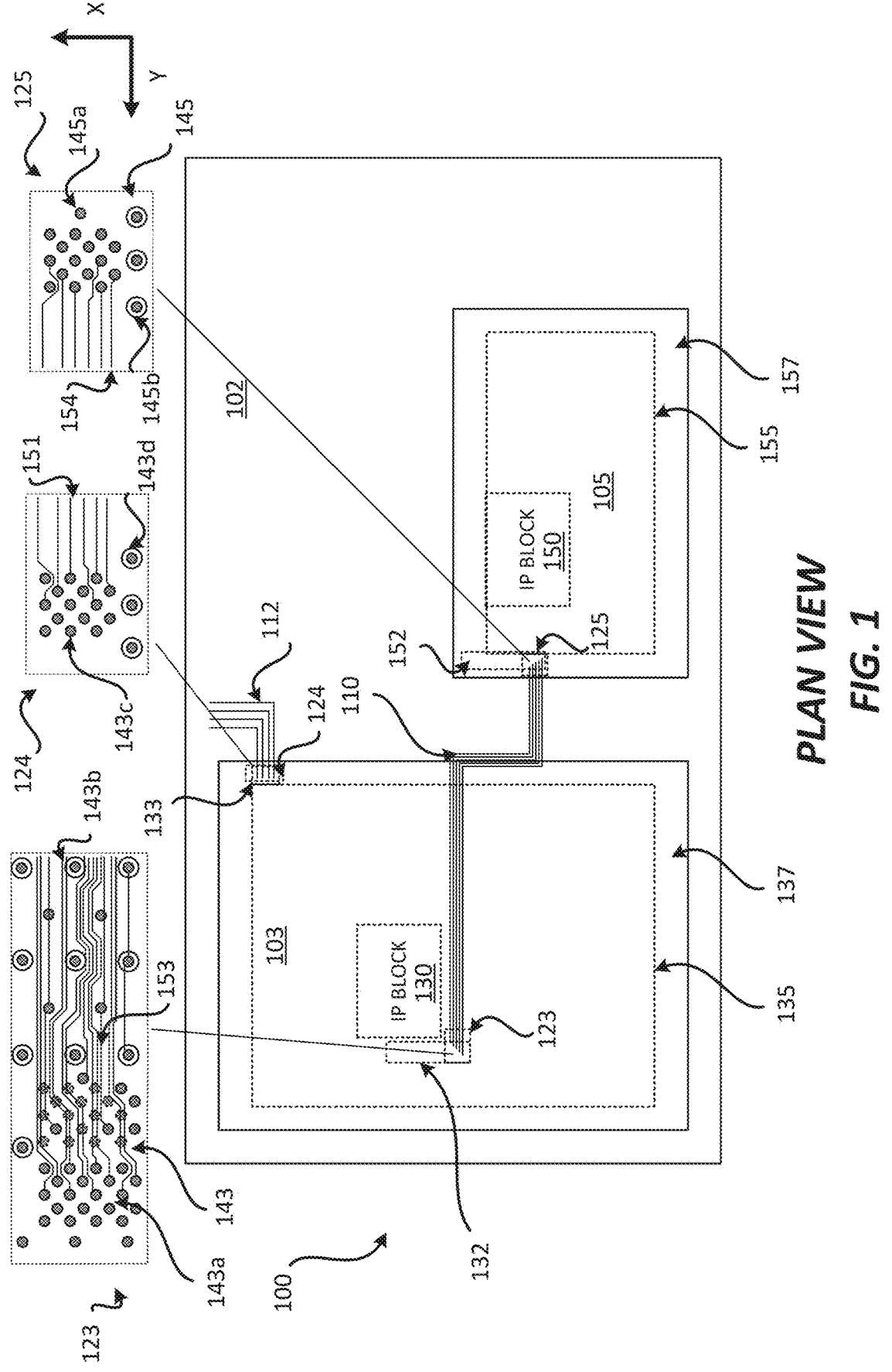
FIG. 1 illustrates an exemplary plan view of a package that includes a substrate and integrated devices configured to be electrically coupled through the substrate.

FIG. 1 illustrates a plan view of a package 100 that includes a substrate and integrated devices configured to be electrically coupled together through interconnects of the substrate. The package 100 includes a substrate 102, an integrated device 103 and an integrated device 105. The integrated device 103 may be a first integrated device. The integrated device 105 may be a second integrated device. The integrated device 103 is coupled to a first surface (e.g., top surface) of the substrate 102. The integrated device 105 is coupled to the first surface of the substrate 102.

The integrated device 103 includes a block 130. The block 130 may represent a functional block of the integrated device 103 that is configured to perform one or more operations for the integrated device 103. The block 130 may represent an intellectual property (IP) block. The block 130 may include one or more logical blocks. Each logical block may include one or more transistors (e.g., plurality of transistors). The integrated device 105 includes a block 150. The block 150 may represent a functional block of the integrated device 105 that is configured to perform one or more operations for the integrated device 105. The block 150 may represent an intellectual property (IP) block. The block 150 may include one or more logical blocks. Each logical block may include one or more transistors (e.g., plurality of transistors).

Figure 6:
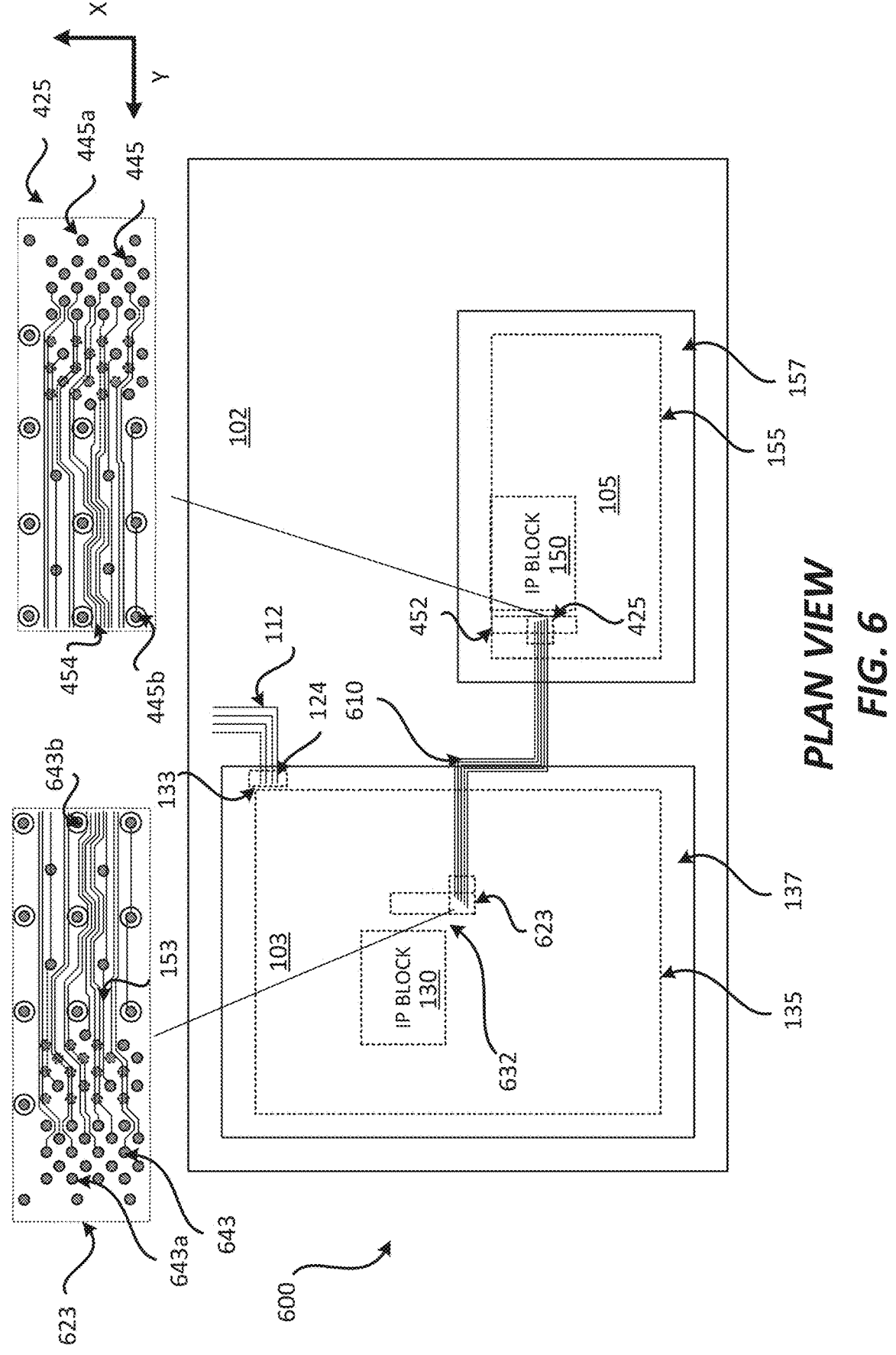
FIG. 6 illustrates an exemplary plan view of a package that includes a substrate and integrated devices configured to be electrically coupled through the substrate.

The integrated device 103 includes an inner portion 135 and a perimeter portion 137. The inner portion 135 may be a portion of the integrated device 103 that includes logical blocks and/or transistors. The perimeter portion 137 may be a portion of the integrated device 103 that surrounds the inner portion 135. The perimeter portion 137 may be a periphery portion of the integrated device 103. The perimeter portion 137 may be a portion that includes one or more edges (e.g., four edges) of the integrated device 103. The perimeter portion 137 may be a portion of the integrated device 103 that is free of logical blocks and/or transistors. The block 130 is located in the inner portion 135. The integrated device 103 includes a die-to-die input/output portion 132. The die-to-die input/output portion 132 is located in the inner portion 135. The die-to-die input/output portion 132 may be a portion of the integrated device 103 that includes interconnects that are configured to provide one or more electrical paths, pins and/or terminals for input/output signals to and/or from another integrated device (e.g., 105). The die-to-die input/output portion 132 is located near to the block 130. For example, the die-to-die input/output portion 132 may be located within 3 millimeters of the block 130 (e.g., within 3 millimeters of logical blocks and/or transistors of the block 130) of the integrated device 103. Thus, for example, the die-to-die input/output portion 132 may be horizontally offset from any part of the block 130, by 3 millimeters or less (e.g., horizontally offset by 3 millimeters or less, from logical blocks and/or transistors of the block 130). In some implementations, the die-to-die input/output portion 132 may vertically overlap (e.g., partial vertical overlap, complete vertical overlap) with any part of the block 130 (e.g., vertically overlap with logical blocks and/or transistors of the block 130). The die-to-die input/output portion 132 may be located closer to the center of the integrated device 103 than being closer to an edge of the integrated device 103. Thus, one or more input/output signals between the integrated device 103 and the integrated device 105 may enter and/or exit the integrated device 103 through the inner portion 135 of the integrated device 103. FIG. 1 illustrates one example of where the die-to-die input/output portion 132 may be located in the inner portion 135 of the integrated device 103. The die-to-die input/output portion 132 is located between the block 130 and the edge of the integrated device 103 that is farthest away from the integrated device 105. However, different implementations may have a die-to-die input/output portion 132 that is located in another location. For example, the die-to-die input/output portion 132 may be located in a part of the integrated device 103 that is closer to the integrated device 105, as shown in FIG. 6. Thus, with respect to the X-Y coordinate system shown in FIG. 1, the die-to-die input/output portion 132 may be located to the right, to the left, above and/or below (in the X-Y coordinate system) the block 130. It is noted that the integrated device 103 may include other electrical paths for input/output signals to other components. In some implementations, these electrical paths for input/output signals to/from other components may extend through the perimeter portion 137 of the integrated device 103. That is, input/output signals to and from other components (e.g., other integrated devices) may enter and/or exit through the perimeter portion 137 of the integrated device 103.

For example, the integrated device 103 includes an input/output portion 133. The input/output portion 133 is located in the perimeter portion 137. The input/output portion 133 may be a portion of the integrated device 103 that includes interconnects that are configured to provide one or more electrical paths, pins and/or terminals for input/output signals to and/or from other integrated device(s) (not shown) that is not the integrated device 105. The input/output portion 133 may be an example of another a die-to-die input/output portion of the integrated device 103.

Thus, the integrated device 103 may include (i) a first plurality of input/output interconnects configured to provide at least one electrical path that enters and/or exist through the inner portion 135 of the integrated device 103, and (ii) a second plurality of input/output interconnects configured to provide at least one electrical path that enters and/or exist through the perimeter portion 137 of the integrated device 103. For example, the integrated device 103 may include (i) a first plurality of input/output interconnects configured to provide at least one electrical path that enters and/or exist through the die-to-die input/output portion 132 of the integrated device 103, and (ii) a second plurality of input/output interconnects configured to provide at least one electrical path that enters and/or exist through the input/output portion 133 of the integrated device 103.

The integrated device 105 includes an inner portion 155 and a perimeter portion 157. The inner portion 155 may be a portion of the integrated device 105 that includes logical blocks and/or transistors. The perimeter portion 157 may be a portion of the integrated device 105 that surrounds the inner portion 155. The perimeter portion 157 may be a periphery portion of the integrated device 105. The perimeter portion 157 may be a portion that includes one or more edges (e.g., four edges) of the integrated device 105. The perimeter portion 157 may be a portion of the integrated device 105 that is free of logical blocks and/or transistors. The block 150 is located in the inner portion 155. The integrated device 105 includes a die-to-die input/output portion 152. The die-to-die input/output portion 152 is located in the perimeter portion 157. The die-to-die input/output portion 152 may be a portion of the integrated device 105 that includes interconnects that are configured to provide one or more electrical paths, pins and/or terminals for input/output signals to and/or from another integrated device (e.g., 103). Thus, one or more input/output signals between the integrated device 103 and the integrated device 105 may enter and/or exit the integrated device 105 through the perimeter portion 157 of the integrated device 105.

The substrate 102 includes a first portion 123, a portion 124 and a second portion 125. The first portion 123 of the substrate 102 includes a first plurality of first pad interconnects 143a, a second plurality of first pad interconnects 143b and a plurality of interconnects 153. The first plurality of first pad interconnects 143a may include a first minimum spacing between neighboring first pad interconnects. The second plurality of first pad interconnects 143b may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of first pad interconnects 143b may laterally surround the first plurality of first pad interconnects 143a. The first portion 123 of the substrate 102 may vertically overlap (e.g., partial vertical overlap) with the die-to-die input/output portion 132 of the integrated device 103. The die-to-die input/output portion 132 may include a first plurality of pads, a first plurality of under bump metallization interconnects and/or a first plurality of pillar interconnects. The first plurality of pads, the first plurality of under bump metallization interconnects and/or the first plurality of pillar interconnects of the die-to-die input/output portion 132 may have a minimum spacing that is less than the a minimum spacing of a second plurality of pads, a second plurality of under bump metallization interconnects and/or a second plurality of pillar interconnects of the integrated device 103 that are located in the inner portion 135 but outside of the die-to-die input/output portion 132.

The portion 124 of the substrate 102 includes a first plurality of first pad interconnects 143c, a second plurality of first pad interconnects 143d and a plurality of interconnects 151. The first plurality of first pad interconnects 143c may include a first minimum spacing between neighboring first pad interconnects. The second plurality of first pad interconnects 143d may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of first pad interconnects 143d may partially and laterally surround the first plurality of first pad interconnects 143c. The portion 124 of the substrate 102 may vertically overlap (e.g., partial vertical overlap) with the input/output portion 133 of the integrated device 103. The substrate 102 includes a plurality of interconnects 112. The plurality of interconnects 112 are configured to be coupled to the integrated device 103 and another integrated device (not shown). The plurality of interconnects 112 may be configured to provide at least one electrical path between the integrated device 103 and the another integrated device (not shown). The another integrated device (not shown) may be coupled to the substrate 102 or coupled to a board (e.g., printed circuit board (PCB)). The plurality of interconnects 112 may include the first plurality of first pad interconnects 143c and the plurality of interconnects 151.

The second portion 125 of the substrate 102 includes a first plurality of second pad interconnects 145a, a second plurality of second pad interconnects 145b and a plurality of interconnects 154. The first plurality of second pad interconnects 145a may include a third minimum spacing between neighboring second pad interconnects. The second plurality of second pad interconnects 145b may include a fourth minimum spacing between neighboring second pad interconnects. The fourth minimum spacing may be greater than the third minimum spacing. The third minimum spacing may be a first minimum spacing for the integrated device 105. The fourth minimum spacing may be a second minimum spacing for the integrated device 105. The second plurality of second pad interconnects 145b may laterally surround the first plurality of second pad interconnects 145a. The second portion 125 of the substrate 102 may vertically overlap (e.g., partial vertical overlap) with the die-to-die input/output portion 152 of the integrated device 105.

The plurality of interconnects 110 may include the first plurality of first pad interconnects 143a, the plurality of interconnects 153, the plurality of interconnects 154, and the first plurality of second pad interconnects 145a. One or more electrical paths for one or more electrical signals (e.g., input/output signals) between the integrated device 103 and the integrated device 105, may include the first plurality of first pad interconnects 143a, the plurality of interconnects 153, the plurality of interconnects 154, the first plurality of second pad interconnects 145a.

As shown in FIG. 1, one or more electrical paths that include the plurality of interconnects 110 may extend through the substrate 102 such that the electrical path (s) is/are located below (in the Z direction) the inner portion 135 and the perimeter portion 137 of the integrated device 103, along and below (in the Z-direction) an edge of the integrated device 103 and below (in the Z-direction) the perimeter portion 157 of the integrated device 105. In some implementations, one or more electrical paths between the integrated device 103 and the integrated device 105 extend below (in the Z-direction) at least half of the width of the integrated device 103.

Figure 2:
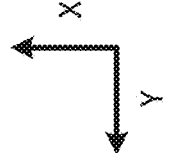
FIG. 2 illustrates an exemplary plan view of a package that includes a substrate and integrated devices configured to be electrically coupled through the substrate.

FIG. 2 illustrates a plan view of the package 100 with solder interconnects located between a substrate and integrated devices. The package 100 includes the substrate 102, the integrated device 103 and the integrated device 105. The integrated device 103 is coupled to the substrate 102 through a first plurality of solder interconnects 230. The integrated device 105 is coupled to the substrate 102 through a second plurality of solder interconnects 250. The package 100 may also include the first plurality of solder interconnects 230 and the second plurality of solder interconnects 250.

The first plurality of solder interconnects 230 include a first plurality of inner solder interconnects 235 and a first plurality of perimeter solder interconnects 237. The first plurality of perimeter solder interconnects 237 may laterally surround the first plurality of inner solder interconnects 235. The first plurality of inner solder interconnects 235 may be located between the substrate 102 and the inner portion 135 of the integrated device 103. The first plurality of perimeter solder interconnects 237 may be located (e.g., located vertically) between the substrate 102 and the perimeter portion 137 of the integrated device 103.

The first plurality of inner solder interconnects 235 includes a first plurality of first inner solder interconnects 235a and a second plurality of first inner solder interconnects 235b. The second plurality of first inner solder interconnects 235b may laterally surround the first plurality of first inner solder interconnects 235a.

The first plurality of first inner solder interconnects 235a may include a first minimum spacing between neighboring first inner solder interconnects. The second plurality of first inner solder interconnects 235b may include a second minimum spacing between neighboring first inner solder interconnects. The second minimum spacing may be greater than the first minimum spacing. The first minimum spacing may be less than the second minimum spacing. The first plurality of first inner solder interconnects 235a may be located (e.g., located vertically) between the substrate 102 and the die-to-die input/output portion 132 of the integrated device 103.

For example, the first plurality of first inner solder interconnects 235a may vertically overlap with the die-to-die input/output portion 132 of the integrated device 103. The first plurality of first inner solder interconnects 235a may be coupled to the first plurality of first pad interconnects 143a.

The first plurality of perimeter solder interconnects 237 includes a first plurality of first perimeter solder interconnects 237a and a second plurality of first perimeter solder interconnects 237b.

The first plurality of first perimeter solder interconnects 237a may include a first minimum spacing between neighboring first perimeter solder interconnects. The second plurality of first perimeter solder interconnects 237b may include a second minimum spacing between neighboring first perimeter solder interconnects. The second minimum spacing may be greater than the first minimum spacing. The first minimum spacing may be less than the second minimum spacing. The first plurality of first perimeter solder interconnects 237a may be located (e.g., located vertically) between the substrate 102 and the perimeter portion 137 of the integrated device 103. The first plurality of first perimeter solder interconnects 237a may be located (e.g., located vertically) between the substrate 102 and the input/output portion 133 of the integrated device 103. For example, the first plurality of first perimeter solder interconnects 237a may vertically overlap with the input/output portion 133 of the integrated device 103. The plurality of interconnects 112 may be configured to be coupled to the first plurality of first perimeter solder interconnects 237a. One or more electrical paths that include the plurality of interconnects 112 may also include the first plurality of first perimeter solder interconnects 237a. The first plurality of first perimeter solder interconnects 237a may be coupled to the first plurality of first pad interconnects 143c. The input/output portion 133 may include a first plurality of pads, a first plurality of under bump metallization interconnects and/or a first plurality of pillar interconnects. The first plurality of pads, the first plurality of under bump metallization interconnects and/or the first plurality of pillar interconnects of the input/output portion 133 may have a minimum spacing that is less than the a minimum spacing of a second plurality of pads, a second plurality of under bump metallization interconnects and/or a second plurality of pillar interconnects of the integrated device 103 that are located in the perimeter portion 137 but outside of the input/output portion 133.

The second plurality of solder interconnects 250 include a second plurality of inner solder interconnects 255 and a second plurality of perimeter solder interconnects 257. The second plurality of perimeter solder interconnects 257 may laterally surround the second plurality of inner solder interconnects 255. The second plurality of inner solder interconnects 255 may be located (e.g., located vertically) between the substrate 102 and the inner portion 155 of the integrated device 105. The second plurality of perimeter solder interconnects 257 may be located (e.g., located vertically) between the substrate 102 and the perimeter portion 157 of the integrated device 105.

The second plurality of perimeter solder interconnects 257 includes a first plurality of second perimeter solder interconnects 257a and a second plurality of second perimeter solder interconnects 257b. The second plurality of second perimeter solder interconnects 257b may partially and laterally surround the first plurality of second perimeter solder interconnects 257a. For example, the edge side of the first plurality of second perimeter solder interconnects 257a may not be facing a plurality of perimeter solder interconnects from the integrated device 105.

The first plurality of second perimeter solder interconnects 257a may include a third minimum spacing between neighboring second perimeter solder interconnects. The second plurality of second perimeter solder interconnects 257b may include a fourth minimum spacing between neighboring second perimeter solder interconnects. The fourth minimum spacing may be greater than the third minimum spacing. The third minimum spacing may be less than the fourth minimum spacing. The third minimum spacing may be a first minimum spacing for solder interconnects coupled to the integrated device 105. The fourth minimum spacing may be a second minimum spacing for solder interconnects coupled to the integrated device 105. The first plurality of second perimeter solder interconnects 257a may be located (e.g., located vertically) between the substrate 102 and the die-to-die input/output portion 152 of the integrated device 105. For example, the first plurality of second perimeter solder interconnects 257a may vertically overlap with the die-to-die input/output portion 152 of the integrated device 105. The first plurality of second perimeter solder interconnects 257a may be coupled to the first plurality of second pad interconnects 145a. The die-to-die input/output portion 152 may include a first plurality of pads, a first plurality of under bump metallization interconnects and/or a first plurality of pillar interconnects. The first plurality of pads, the first plurality of under bump metallization interconnects and/or the first plurality of pillar interconnects of the die-to-die input/output portion 152 may have a minimum spacing that is less than the a minimum spacing of a second plurality of pads, a second plurality of under bump metallization interconnects and/or a second plurality of pillar interconnects of the integrated device 105 that are located in the perimeter portion 157 but outside of the die-to-die input/output portion 152.

One or more electrical paths for one or more electrical signals (e.g., input/output signals) between the integrated device 103 and the integrated device 105, may include the first plurality of first inner solder interconnects 235a, the first plurality of first pad interconnects 143a, the plurality of interconnects 153, the plurality of interconnects 110, the plurality of interconnects 154, the first plurality of second pad interconnects 145a and/or the first plurality of second perimeter solder interconnects 257a.

Figure 3:
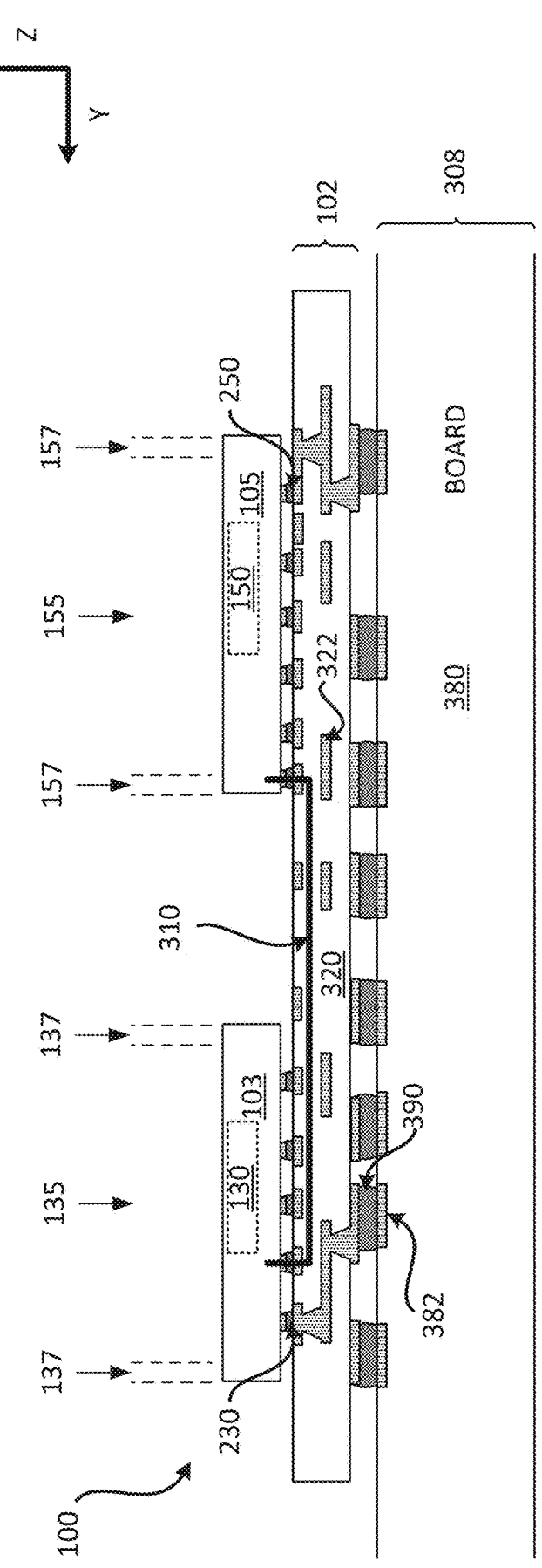
FIG. 3 illustrates an exemplary cross sectional profile view of a package that includes a substrate and integrated devices configured to be electrically coupled through the substrate.

FIG. 3 illustrates a cross sectional profile view of the package 100. The package 100 is coupled to a board 308. The board 308 may include a printed circuit board (PCB). The board 308 includes at least one board dielectric layer 380 and a plurality of board interconnects 382. The package 100 is coupled to the board 308 through a plurality of solder interconnects 390. The substrate 102 includes at least one dielectric layer 320 and a plurality of interconnects 322. The plurality of interconnects 322 may include and/or represent the plurality of interconnects 110, the plurality of interconnects 112, the plurality of interconnects 151, the plurality of interconnects 153, the plurality of interconnects 154 and/or the first plurality of pad interconnects 143.

The integrated device 103 is coupled to the substrate 102 through the first plurality of solder interconnects 230. The integrated device 105 is coupled to the substrate 102 through the second plurality of solder interconnects 250. The integrated device 103 is configured to be electrically coupled to the integrated device 105 through an electrical path 310. The electrical path 310 may be an electrical path 310 for input/output signals between the integrated device 103 and the integrated device 105. The electrical path 310 includes at least one solder interconnect from the first plurality of solder interconnects 230, at least one interconnect from the plurality of interconnects 322 and at least one solder interconnect from the second plurality of solder interconnects 250. For example, the electrical path 310 may include the first plurality of first inner solder interconnects 235a, the first plurality of first pad interconnects 143a, the plurality of interconnects 153, the plurality of interconnects 154, the plurality of interconnects 110, the first plurality of second pad interconnects 145a and/or the first plurality of second perimeter solder interconnects 257a.

The electrical path 310 includes a portion of the integrated device 103 that is near and/or is adjacent to the block 130 of the integrated device 103. The electrical path 310 enters and/or exits through the inner portion 135 of the integrated device 103. This configuration of the electrical path 310 helps reduce the need for die level routing in the integrated device 103, which can help reduce die level routing congestion. Also, fewer die interconnects in the integrated device 103 means that the integrated device 103 can have a smaller form factor. Additionally, an electrical path through the substrate 106 rather than through the integrated device 103 may help improve routing latency, memory latency and/or reduce power consumption by the integrated device 103. This is because signals may be able to travel faster through interconnects of a substrate than through interconnects of the integrated device 103. In some implementations, depending on the size (e.g., width) of the integrated device 103, up to 20 nanoseconds of latency (e.g., memory latency) may be eliminated and/or up to 1 watt of power may be reduced when implementing the electrical path 310, instead of an electrical path that includes more interconnects in the integrated device 103 that travels through a substantial portion of the width of the integrated device 103. The electrical path 310 enters and/or exits through the perimeter portion 157 of the integrated device 105.

Figure 4:
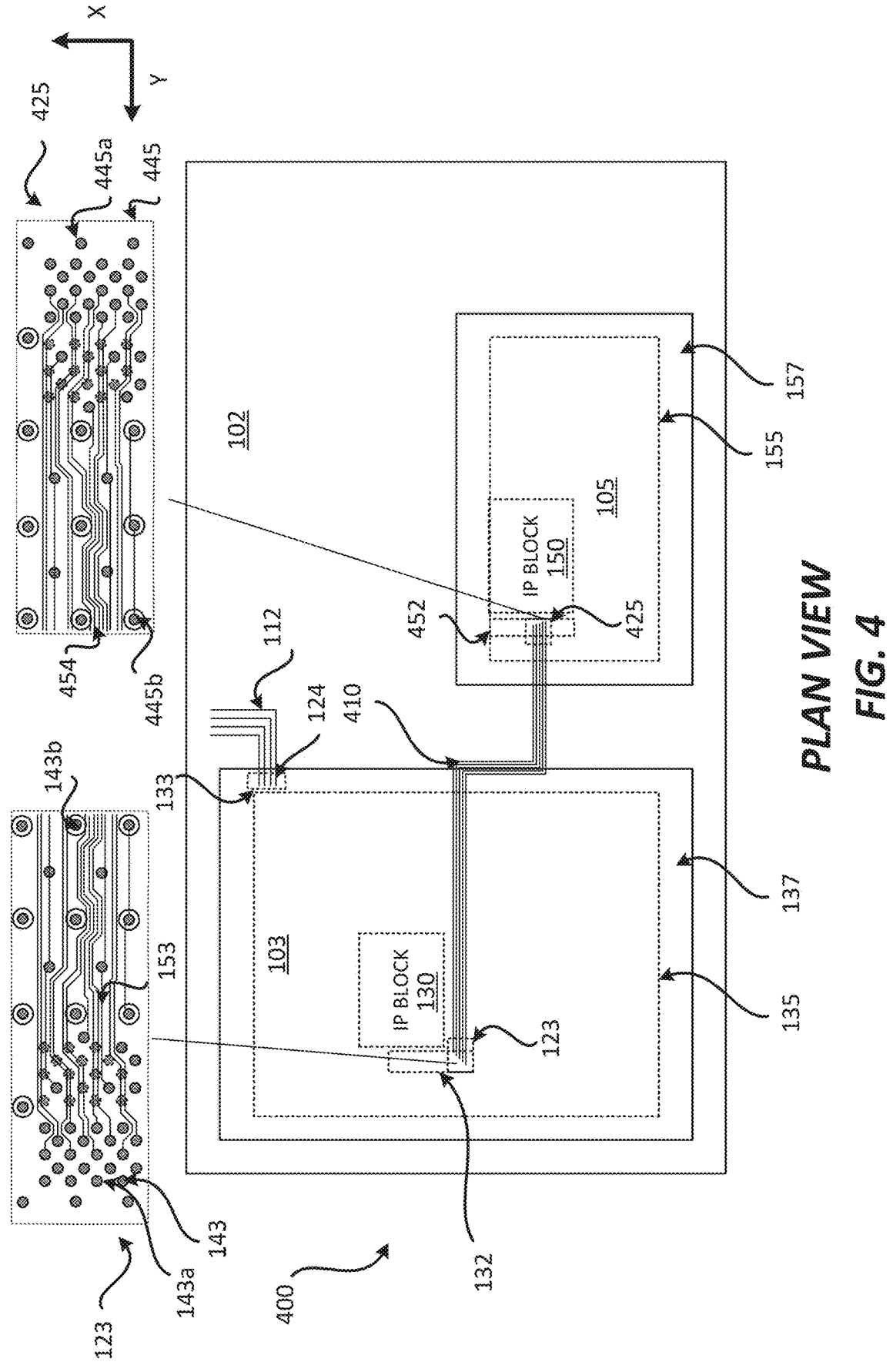
FIG. 4 illustrates an exemplary plan view of a package that includes a substrate and integrated devices configured to be electrically coupled through the substrate.

FIG. 4 illustrates a plan view of a package 400 that includes a substrate and integrated devices configured to be electrically coupled together through interconnects of the substrate. The package 400 includes a substrate 102, an integrated device 103 and an integrated device 105. The integrated device 103 may be a first integrated device. The integrated device 105 may be a second integrated device. The integrated device 103 is coupled to a first surface (e.g., top surface) of the substrate 102. The integrated device 105 is coupled to the first surface of the substrate 102. The package 400 is similar to the package 100, and includes similar components as the package 100. The integrated device 103 of FIG. 4 is similar to the integrated device 103 of at least FIG. 1.

The integrated device 105 includes an inner portion 155 and a perimeter portion 157. The inner portion 155 may be a portion of the integrated device 105 that includes logical blocks and/or transistors. The perimeter portion 157 may be a portion of the integrated device 105 that surrounds the inner portion 155. The perimeter portion 157 may be a portion of the integrated device 105 that is free of logical blocks and/or transistors. The block 150 is located in the inner portion 155. The integrated device 105 includes a die-to-die input/output portion 452. The die-to-die input/output portion 452 is located in the inner portion 155. The die-to-die input/output portion 452 may be a portion of the integrated device 105 that includes interconnects that are configured to provide one or more electrical paths, pins and/or terminals for input/output signals to and/or from another integrated device (e.g., 103). The die-to-die input/output portion 452 is located near the block 150. For example, the die-to-die input/output portion 452 may be located within 3 millimeters of the block 150 (e.g., within 3 millimeters of logical blocks and/or transistors of the block 150) of the integrated device 105. Thus, for example, the die-to-die input/output portion 452 may be horizontally offset from any part of the block 150, by 3 millimeters or less (e.g., horizontally offset by 3 millimeters or less, from logical blocks and/or transistors of the block 150). In some implementations, the die-to-die input/output portion 452 may vertically overlap (e.g., partial vertical overlap, complete vertical overlap) with any part of the block 150 (e.g., vertically overlap with logical blocks and/or transistors of the block 150). Thus, one or more input/output signals between the integrated device 103 and the integrated device 105 may enter and/or exit the integrated device 105 through the inner portion 155 of the integrated device 105. It is noted that the integrated device 105 may include other electrical paths for input/output signals to and from other components. In some implementations, these electrical paths for input/output signals to and from other components may extend through the perimeter portion 157 of the integrated device 105. That is, input/output signals to and from other components may enter and exit through the perimeter portion 157 of the integrated device 105.

The substrate 102 includes a first portion 123, a portion 124 and a second portion 425. The first portion 123 of the substrate 102 includes a first plurality of first pad interconnects 143a, a second plurality of first pad interconnects 143b and a plurality of interconnects 153. The first plurality of first pad interconnects 143a may include a first minimum spacing between neighboring first pad interconnects. The second plurality of first pad interconnects 143b may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of first pad interconnects 143b may laterally surround the first plurality of first pad interconnects 143a. The first portion 123 of the substrate 102 may vertically overlap (e.g., partial vertical overlap) with the die-to-die input/output portion 132 of the integrated device 103.

As mentioned above, the portion 124 of the substrate 102 includes a first plurality of first pad interconnects 143c, a second plurality of first pad interconnects 143d and a plurality of interconnects 151. The first plurality of first pad interconnects 143c may include a first minimum spacing between neighboring first pad interconnects. The second plurality of first pad interconnects 143d may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of first pad interconnects 143d may partially and laterally surround the first plurality of first pad interconnects 143c. The portion 124 of the substrate 102 may vertically overlap (e.g., partial vertical overlap) with the input/output portion 133 of the integrated device 103.

The second portion 425 of the substrate 102 includes a first plurality of second pad interconnects 445a, a second plurality of second pad interconnects 445b and a plurality of interconnects 454. The first plurality of second pad interconnects 445a may include a third minimum spacing between neighboring second pad interconnects. The second plurality of second pad interconnects 445b may include a fourth minimum spacing between neighboring second pad interconnects. The fourth minimum spacing may be greater than the third minimum spacing. The third minimum spacing may be a first minimum spacing for the integrated device 105. The fourth minimum spacing may be a second minimum spacing for the integrated device 105. The second plurality of second pad interconnects 445b may laterally surround the first plurality of second pad interconnects 445a. The second portion 425 of the substrate 102 may vertically overlap (e.g., partial vertical overlap) with the die-to-die input/output portion 452 of the integrated device 105.

The plurality of interconnects 410 may include interconnects from the substrate 102. The plurality of interconnects 410 may include the first plurality of first pad interconnects 143a, the plurality of interconnects 153, the plurality of interconnects 454, and the first plurality of second pad interconnects 445a. One or more electrical paths for one or more electrical signals (e.g., input/output signals) between the integrated device 103 and the integrated device 105, may include the first plurality of first pad interconnects 143a, the plurality of interconnects 153, the plurality of interconnects 454, the first plurality of second pad interconnects 445a. The plurality of interconnects 410 may be configured to be coupled to the die-to-die input/output portion 132 of the integrated device 103 and the die-to-die input/output portion 452 of the integrated device 105.

The plurality of interconnects 112 may include interconnects from the substrate 102. One or more electrical paths for one or more electrical signals (e.g., input/output signals) between the integrated device 103 and one or more integrated devices that is not the integrated device 105, may include a first plurality of first pad interconnects 143c, and/or the plurality of interconnects 151. The plurality of interconnects 112 may be configured to be coupled to the input/output portion 133 of the integrated device 103.

As shown in FIG. 4, one or more electrical paths that includes the plurality of interconnects 410 may extend through the substrate 102 such that the electrical path (s) is/are located below (in the Z-direction) the inner portion 135 and the perimeter portion 137 of the integrated device 103, along and below (in the Z-direction) an edge of the integrated device 103, below (in the Z-direction) the perimeter portion 157 of the integrated device 105 and below (in the Z-direction) the inner portion 155 of the integrated device 105. In some implementations, one or more electrical paths between the integrated device 103 and the integrated device 105 may extend below at least half of the width of the integrated device 103 and/or at least half of the width of the integrated device 105.

Figure 5:
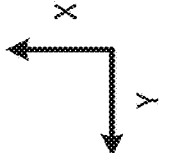
FIG. 5 illustrates an exemplary plan view of a package that includes a substrate and integrated devices configured to be electrically coupled through the substrate.

FIG. 5 illustrates a plan view of the package 400 with solder interconnects located between a substrate and integrated devices. The package 400 includes the substrate 102, the integrated device 103 and the integrated device 105. The integrated device 103 is coupled to the substrate 102 through a first plurality of solder interconnects 230. The integrated device 105 is coupled to the substrate 102 through a second plurality of solder interconnects 250. The package 400 may also include the first plurality of solder interconnects 230 and the second plurality of solder interconnects 250.

The first plurality of solder interconnects 230 include a first plurality of inner solder interconnects 235 and a first plurality of perimeter solder interconnects 237. The first plurality of perimeter solder interconnects 237 may laterally surround the first plurality of inner solder interconnects 235. The first plurality of inner solder interconnects 235 may be located between the substrate 102 and the inner portion 135 of the integrated device 103. The first plurality of perimeter solder interconnects 237 may be located between the substrate 102 and the perimeter portion 137 of the integrated device 103.

The first plurality of inner solder interconnects 235 includes a first plurality of first inner solder interconnects 235a and a second plurality of first inner solder interconnects 235b. The second plurality of first inner solder interconnects 235b may laterally surround the first plurality of first inner solder interconnects 235a.

The first plurality of first inner solder interconnects 235a may include a first minimum spacing between neighboring first inner solder interconnects. The second plurality of first inner solder interconnects 235b may include a second minimum spacing between neighboring first inner solder interconnects. The second minimum spacing may be greater than the first minimum spacing. The first minimum spacing may be less than the second minimum spacing. The first plurality of first inner solder interconnects 235a may be located between the substrate 102 and the die-to-die input/output portion 132 of the integrated device 103. For example, the first plurality of first inner solder interconnects 235a may vertically overlap with the die-to-die input/output portion 132 of the integrated device 103.

The first plurality of perimeter solder interconnects 237 includes a first plurality of first perimeter solder interconnects 237a and a second plurality of first perimeter solder interconnects 237b.

The first plurality of first perimeter solder interconnects 237a may include a first minimum spacing between neighboring first perimeter solder interconnects. The second plurality of first perimeter solder interconnects 237b may include a second minimum spacing between neighboring first perimeter solder interconnects. The second minimum spacing may be greater than the first minimum spacing. The first minimum spacing may be less than the second minimum spacing. The first plurality of first perimeter solder interconnects 237a may be located (e.g., located vertically) between the substrate 102 and the perimeter portion 137 of the integrated device 103. The first plurality of first perimeter solder interconnects 237a may be located (e.g., located vertically) between the substrate 102 and the input/output portion 133 of the integrated device 103. For example, the first plurality of first perimeter solder interconnects 237a may vertically overlap with the input/output portion 133 of the integrated device 103. The plurality of interconnects 112 may be configured to be coupled to the first plurality of first perimeter solder interconnects 237a. One or more electrical paths that include the plurality of interconnects 112 may also include the first plurality of first perimeter solder interconnects 237a.

The second plurality of solder interconnects 250 include a second plurality of inner solder interconnects 255 and a second plurality of perimeter solder interconnects 257. The second plurality of perimeter solder interconnects 257 may laterally surround the second plurality of inner solder interconnects 255. The second plurality of inner solder interconnects 255 may be located between the substrate 102 and the inner portion 155 of the integrated device 105. The second plurality of perimeter solder interconnects 257 may be located between the substrate 102 and the perimeter portion 157 of the integrated device 105.

The second plurality of inner solder interconnects 255 includes a first plurality of second inner solder interconnects 255a and a second plurality of second inner solder interconnects 255b. The second plurality of second inner solder interconnects 255b may laterally surround the first plurality of second inner solder interconnects 255a.

The first plurality of second inner solder interconnects 255a may include a third minimum spacing between neighboring second inner solder interconnects. The second plurality of second inner solder interconnects 255b may include a fourth minimum spacing between neighboring second inner solder interconnects. The fourth minimum spacing may be greater than the third minimum spacing. The third minimum spacing may be less than the fourth minimum spacing. The third minimum spacing may be a first minimum spacing for solder interconnects coupled to the integrated device 105. The fourth minimum spacing may be a second minimum spacing for solder interconnects coupled to the integrated device 105. The first plurality of second inner solder interconnects 255a may be located between substrate 102 and the die-to-die input/output portion 452 of the integrated device 105. For example, the first plurality of second inner solder interconnects 255a may vertically overlap with the die-to-die input/output portion 452 of the integrated device 105. The first plurality of second inner solder interconnects 255a may be coupled to the first plurality of second pad interconnects 445a. The die-to-die input/output portion 452 may include a first plurality of pads, a first plurality of under bump metallization interconnects and/or a first plurality of pillar interconnects. The first plurality of pads, the first plurality of under bump metallization interconnects and/or the first plurality of pillar interconnects of the die-to-die input/output portion 452 may have a minimum spacing that is less than the a minimum spacing of a second plurality of pads, a second plurality of under bump metallization interconnects and/or a second plurality of pillar interconnects of the integrated device 105 that are located in the inner portion 155 but outside of the die-to-die input/output portion 452.

One or more electrical paths for one or more electrical signals (e.g., input/output signals) between the integrated device 103 and the integrated device 105, may include the first plurality of first inner solder interconnects 235a, the first plurality of first pad interconnects 143a, the plurality of interconnects 153, the plurality of interconnects 410, the plurality of interconnects 154, the first plurality of second pad interconnects 145a and/or the first plurality of second inner solder interconnects 255a.

FIG. 6 illustrates a plan view of a package 600 that includes a substrate and integrated devices configured to be electrically coupled together through interconnects of the substrate. The package 600 includes a substrate 102, an integrated device 103 and an integrated device 105. The integrated device 103 may be a first integrated device. The integrated device 105 may be a second integrated device. The integrated device 103 is coupled to a first surface (e.g., top surface) of the substrate 102. The integrated device 105 is coupled to the first surface of the substrate 102. The package 600 is similar to the package 100 and the package 400, and includes similar components as the package 100 and the package 400. The integrated device 103 of FIG. 6 is similar to the integrated device 103 of at least FIG. 1.

The integrated device 103 includes the inner portion 135 and the perimeter portion 137. The inner portion 135 may be a portion of the integrated device 103 that includes logical blocks and/or transistors. The perimeter portion 137 may be a portion of the integrated device 103 that surrounds the inner portion 135. The perimeter portion 137 may be a portion of the integrated device 103 that is free of logical blocks and/or transistors. The block 130 is located in the inner portion 135. The integrated device 103 includes a die-to-die input/output portion 632. The die-to-die input/output portion 632 is located in the inner portion 135. The die-to-die input/output portion 632 may be a portion of the integrated device 103 that includes interconnects that are configured to provide one or more electrical paths, pins and/or terminals for input/output signals to and/or from another integrated device (e.g., 105). The die-to-die input/output portion 632 is located near to the block 130. For example, the die-to-die input/output portion 632 may be located within 3 millimeters of the block 130 (e.g., within 3 millimeters of logical blocks and/or transistors of the block 130) of the integrated device 103. Thus, for example, the die-to-die input/output portion 632 may be horizontally offset from any part of the block 130, by 3 millimeters or less (e.g., horizontally offset by 3 millimeters or less, from logical blocks and/or transistors of the block 130). In some implementations, the die-to-die input/output portion 632 may vertically overlap (e.g., partial vertical overlap, complete vertical overlap) with any part of the block 130 (e.g., vertically overlap with logical blocks and/or transistors of the block 130). The die-to-die input/output portion 632 may be located closer to the center of the integrated device 103 than being closer to an edge of the integrated device 103. The die-to-die input/output portion 632 is located between the block 130 and the edge of the integrated device 103 that is closest to the integrated device 105. Thus, one or more input/output signals between the integrated device 103 and the integrated device 105 may enter and/or exit the integrated device 103 through the inner portion 135 of the integrated device 103.

The integrated device 105 includes an inner portion 155 and a perimeter portion 157. The inner portion 155 may be a portion of the integrated device 105 that includes logical blocks and/or transistors. The perimeter portion 157 may be a portion of the integrated device 105 that surrounds the inner portion 155. The perimeter portion 157 may be a portion of the integrated device 105 that is free of logical blocks and/or transistors. The block 150 is located in the inner portion 155. The integrated device 105 includes a die-to-die input/output portion 452. The die-to-die input/output portion 452 is located in the inner portion 155. The die-to-die input/output portion 452 may be a portion of the integrated device 105 that includes interconnects that are configured to provide one or more electrical paths, pins and/or terminals for input/output signals to and/or from another integrated device (e.g., 103). The die-to-die input/output portion 452 is located near to the block 150. For example, the die-to-die input/output portion 452 may be located within 3 millimeters of the block 150 (e.g., within 3 millimeters of logical blocks and/or transistors of the block 150) of the integrated device 105. Thus, for example, the die-to-die input/output portion 452 may be horizontally offset from any part of the block 150, by 3 millimeters or less (e.g., horizontally offset by 3 millimeters or less, from logical blocks and/or transistors of the block 150). In some implementations, the die-to-die input/output portion 452 may vertically overlap (e.g., partial vertical overlap, complete vertical overlap) with any part of the block 150 (e.g., vertically overlap with logical blocks and/or transistors of the block 150). Thus, one or more input/output signals between the integrated device 103 and the integrated device 105 may enter and/or exit the integrated device 105 through the inner portion 155 of the integrated device 105. It is noted that the integrated device 105 may include other electrical paths for input/output signals to and from other components. In some implementations, these electrical paths for input/output signals to and from other components may extend through the perimeter portion 157 of the integrated device 105. That is, input/output signals to and from other components may enter and exit through the perimeter portion 157 of the integrated device 105. It is noted that as used in the disclosure, when a first component is within 3 millimeters of a second component, the first component may be within 3 millimeters or less of the second component (e.g., within 2 millimeters or less, within 1.5 millimeters or less, within 1 millimeters or less, within 0.4 millimeters or less). Thus, within 3 millimeters or less may mean between 0 and 3 millimeters, inclusive of 0 and 3 millimeters (including any real numbers between 0 and 3 millimeters). It is also noted that a first component that vertically overlaps (e.g., complete vertical overlap, partial vertical overlap) with a second component may be considered to be within 3 millimeters or less of the second component.

The substrate 102 includes a first portion 623, a portion 124 and a second portion 425. The first portion 623 of the substrate 102 includes a first plurality of first pad interconnects 643a, a second plurality of first pad interconnects 643b and a plurality of interconnects 153. The first plurality of first pad interconnects 643a may include a first minimum spacing between neighboring first pad interconnects. The second plurality of first pad interconnects 643b may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of first pad interconnects 643b may laterally surround the first plurality of first pad interconnects 643a. The first portion 623 of the substrate 102 may vertically overlap (e.g., partial vertical overlap) with the die-to-die input/output portion 632 of the integrated device 103.

As mentioned above, the portion 124 of the substrate 102 includes a first plurality of first pad interconnects 143c, a second plurality of first pad interconnects 143d and a plurality of interconnects 151. The first plurality of first pad interconnects 143c may include a first minimum spacing between neighboring first pad interconnects. The second plurality of first pad interconnects 143d may include a second minimum spacing between neighboring first pad interconnects. The second minimum spacing may be greater than the first minimum spacing. The first minimum spacing may be a first minimum spacing for the integrated device 103. The second minimum spacing may be a second minimum spacing for the integrated device 103. The second plurality of second pad interconnects 145d may partially and laterally surround the first plurality of second pad interconnects 145c. The portion 124 of the substrate 102 may vertically overlap (e.g., partial vertical overlap) with the input/output portion 133 of the integrated device 103.

The second portion 425 of the substrate 102 includes a first plurality of second pad interconnects 445a, a second plurality of second pad interconnects 445b and a plurality of interconnects 454. The first plurality of second pad interconnects 445a may include a third minimum spacing between neighboring second pad interconnects. The second plurality of second pad interconnects 445b may include a fourth minimum spacing between neighboring second pad interconnects. The fourth minimum spacing may be greater than the third minimum spacing. The third minimum spacing may be a first minimum spacing for the integrated device 105. The fourth minimum spacing may be a second minimum spacing for the integrated device 105. The second plurality of second pad interconnects 445b may laterally surround the first plurality of second pad interconnects 445a. The second portion 425 of the substrate 102 may vertically overlap (e.g., partial vertical overlap) with the die-to-die input/output portion 452 of the integrated device 105.

The plurality of interconnects 610 may include the first plurality of first pad interconnects 643a, the plurality of interconnects 153, the plurality of interconnects 454, and the first plurality of second pad interconnects 445a. One or more electrical paths for one or more electrical signals (e.g., input/output signals) between the integrated device 103 and the integrated device 105, may include the first plurality of first pad interconnects 643a, the plurality of interconnects 153, the plurality of interconnects 454, the first plurality of second pad interconnects 445a.

As shown in FIG. 6, one or more electrical paths that includes the plurality of interconnects 610 may extend through the substrate 102 such that the electrical path (s) is/are located below (in the Z direction) the inner portion 135 and the perimeter portion 137 of the integrated device 103, along and below (in the Z-direction) an edge of the integrated device 103, below (in the Z-direction) the perimeter portion 157 of the integrated device 105 and below (in the Z-direction) the inner portion 155 of the integrated device 105. In some implementations, one or more electrical paths between the integrated device 103 and the integrated device 105 may extend below (in the Z-direction) at least half of the width of the integrated device 103 and/or at least half of the width of the integrated device 105.

Figure 7:
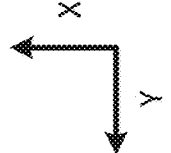
FIG. 7 illustrates an exemplary plan view of a package that includes a substrate and integrated devices configured to be electrically coupled through the substrate.

FIG. 7 illustrates a plan view of the package 600 with solder interconnects located between a substrate and integrated devices. The package 600 includes the substrate 102, the integrated device 103 and the integrated device 105. The integrated device 103 is coupled to the substrate 102 through a first plurality of solder interconnects 230. The integrated device 105 is coupled to the substrate 102 through a second plurality of solder interconnects 250. The package 600 may also include the a first plurality of solder interconnects 230 and the second plurality of solder interconnects 250.

The first plurality of solder interconnects 230 include a first plurality of inner solder interconnects 235 and a first plurality of perimeter solder interconnects 237. The first plurality of perimeter solder interconnects 237 may laterally surround the first plurality of inner solder interconnects 235. The first plurality of inner solder interconnects 235 may be located between the substrate 102 and the inner portion 135 of the integrated device 103. The first plurality of perimeter solder interconnects 237 may be located between the substrate 102 and the perimeter portion 137 of the integrated device 103.

The first plurality of inner solder interconnects 235 includes a first plurality of first inner solder interconnects 235a and a second plurality of first inner solder interconnects 235b. The second plurality of first inner solder interconnects 235b may laterally surround the first plurality of first inner solder interconnects 235a.

The first plurality of first inner solder interconnects 235a may include a first minimum spacing between neighboring first inner solder interconnects. The second plurality of first inner solder interconnects 235b may include a second minimum spacing between neighboring first inner solder interconnects. The second minimum spacing may be greater than the first minimum spacing. The first minimum spacing may be less than the second minimum spacing. The first plurality of first inner solder interconnects 235a may be located between the substrate 102 and the die-to-die input/output portion 632 of the integrated device 103. For example, the first plurality of first inner solder interconnects 235a may vertically overlap with the die-to-die input/output portion 632 of the integrated device 103. The first plurality of first inner solder interconnects 235a may be coupled to the first plurality of first pad interconnects 643a.

The first plurality of perimeter solder interconnects 237 includes a first plurality of first perimeter solder interconnects 237a and a second plurality of first perimeter solder interconnects 237b.

The first plurality of first perimeter solder interconnects 237a may include a first minimum spacing between neighboring first perimeter solder interconnects. The second plurality of first perimeter solder interconnects 237b may include a second minimum spacing between neighboring first perimeter solder interconnects. The second minimum spacing may be greater than the first minimum spacing. The first minimum spacing may be less than the second minimum spacing. The first plurality of first perimeter solder interconnects 237a may be located between the substrate 102 and the input/output portion 133 of the integrated device 103. For example, the first plurality of first perimeter solder interconnects 237a may vertically overlap with the input/output portion 133 of the integrated device 103.

The second plurality of solder interconnects 250 include a second plurality of inner solder interconnects 255 and a second plurality of perimeter solder interconnects 257. The second plurality of perimeter solder interconnects 257 may laterally surround the second plurality of inner solder interconnects 255. The second plurality of inner solder interconnects 255 may be located between the substrate 102 and the inner portion 155 of the integrated device 105. The second plurality of perimeter solder interconnects 257 may be located between the substrate 102 and the perimeter portion 157 of the integrated device 105.

The second plurality of inner solder interconnects 255 includes a first plurality of second inner solder interconnects 255a and a second plurality of second inner solder interconnects 255b. The second plurality of second inner solder interconnects 255b may laterally surround the first plurality of second inner solder interconnects 255a.

The first plurality of second inner solder interconnects 255a may include a third minimum spacing between neighboring second inner solder interconnects. The second plurality of second inner solder interconnects 255b may include a fourth minimum spacing between neighboring second inner solder interconnects. The fourth minimum spacing may be greater than the third minimum spacing. The third minimum spacing may be less than the fourth minimum spacing. The third minimum spacing may be a first minimum spacing for solder interconnects coupled to the integrated device 105. The fourth minimum spacing may be a second minimum spacing for solder interconnects coupled to the integrated device 105. The first plurality of second inner solder interconnects 255a may be located between the substrate 102 and the die-to-die input/output portion 452 of the integrated device 105. For example, the first plurality of second inner solder interconnects 255a may vertically overlap with the die-to-die input/output portion 452 of the integrated device 105. The first plurality of second inner solder interconnects 255a may be coupled to the first plurality of second pad interconnects 445a.

One or more electrical paths for one or more electrical signals (e.g., input/output signals) between the integrated device 103 and the integrated device 105, may include the first plurality of first inner solder interconnects 235a, the first plurality of first pad interconnects 643a, the plurality of interconnects 153, the plurality of interconnects 610, the plurality of interconnects 454, the first plurality of second pad interconnects 445a and/or the first plurality of second inner solder interconnects 255a.

It is noted that the location of the input/output portion 133 of the integrated device 103 is exemplary. The input/output portion 133 of the integrated device 103 may be located anywhere in the perimeter portion 137 of the integrated device 103, and is not limited to the location shown in the disclosure. Similarly, the integrated device 105 may also include one or more input/output portions that are configured to provide an electrical path to other integrated devices. The one or more input/output portions may be located in the perimeter portion 157 of the integrated device 105. The one or more input/output portions may be similar to the die-to-die input/output portion 152, but is instead configured to provide one or more electrical paths between the integrated device 105 and another integrated device (that is not the integrated device 103).

Figure 8:
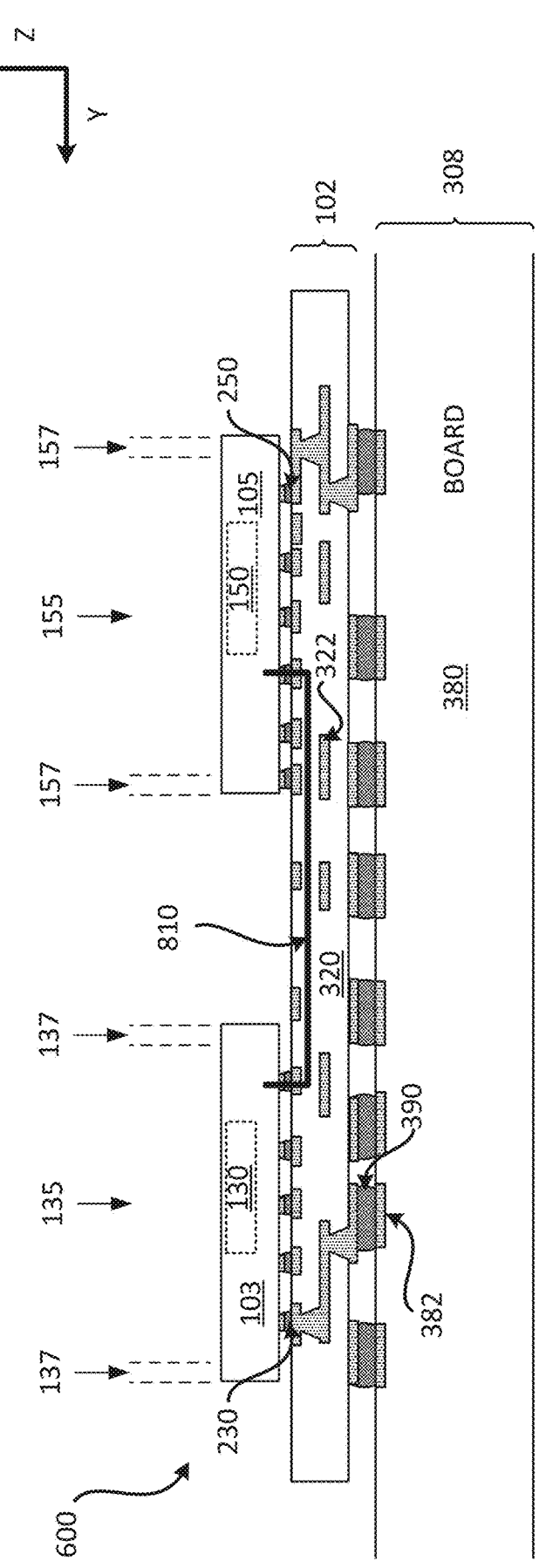
FIG. 8 illustrates an exemplary cross sectional profile view of a package that includes a substrate and integrated devices configured to be electrically coupled through the substrate.

FIG. 8 illustrates a cross sectional profile view of the package 600. The package 600 is coupled to a board 308. The board 308 may include a printed circuit board (PCB). The board 308 includes at least one board dielectric layer 380 and a plurality of board interconnects 382. The package 600 is coupled to the board 308 through a plurality of solder interconnects 390. The substrate 102 includes at least one dielectric layer 320 and a plurality of interconnects 322. The plurality of interconnects 322 may include and/or represent the plurality of interconnects 610, the plurality of interconnects 112, the plurality of interconnects 151, the plurality of interconnects 153, the first plurality of pad interconnects 643, the plurality of interconnects 454, and/or the first plurality of second pad interconnects 445.

The integrated device 103 is coupled to the substrate 102 through the first plurality of solder interconnects 230. The integrated device 105 is coupled to the substrate 102 through the second plurality of solder interconnects 250. The integrated device 103 is configured to be electrically coupled to the integrated device 105 through an electrical path 810. The electrical path 810 may be an electrical path for input/output signals between the integrated device 103 and the integrated device 105. The electrical path 810 includes at least one solder interconnect from the first plurality of solder interconnects 230, at least one interconnect from the plurality of interconnects 322 and at least one solder interconnect from the second plurality of solder interconnects 250. For example, the electrical path 810 may include the first plurality of first inner solder interconnects 235a, the first plurality of first pad interconnects 643a, the plurality of interconnects 153, the plurality of interconnects 454, the plurality of interconnects 610, the first plurality of second pad interconnects 445a and/or the first plurality of second inner solder interconnects 255a. The electrical path 810 enters and/or exits through the inner portion 135 of the integrated device 103. The electrical path 810 enters and/or exits through the inner portion 155 of the integrated device 105.

An integrated device (e.g., 103, 105) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using one or more processes that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

The package (e.g., 100, 400, 600) may be implemented in a radio frequency (RF) package. The RF package may be a radio frequency front end (RFFE) package. A package (e.g., 100, 400, 600) may be configured to provide Wireless Fidelity (WiFi) communication and/or cellular communication (e.g., 2G, 3G, 4G, 5G). The packages (e.g., 100, 400, 600) may be configured to support Global System for Mobile (GSM) Communications, Universal Mobile Telecommunications System (UMTS), and/or Long-Term Evolution (LTE). The packages (e.g., 100, 400, 600) may be configured to transmit and receive signals having different frequencies and/or communication protocols.

Figure 9:
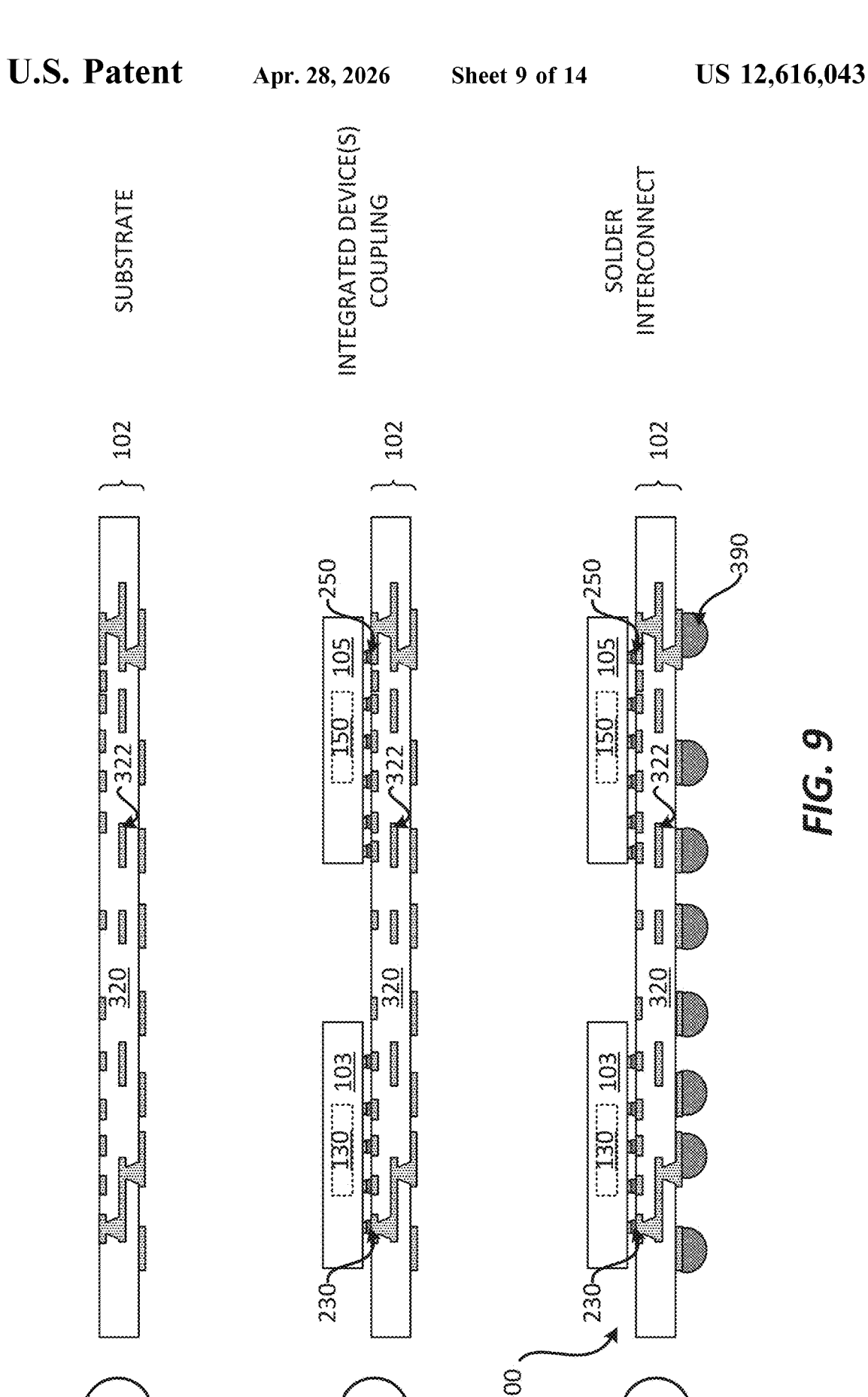
FIG. 9 illustrates an exemplary sequence for fabricating a package that includes a substrate and integrated devices.

Exemplary Sequence for Fabricating a Package Comprising a Substrate and Integrated Devices In some implementations, fabricating a package includes several processes. FIG. 9 illustrates an exemplary sequence for providing or fabricating a package. In some implementations, the sequence of FIG. 9 may be used to provide or fabricate the package 100. However, the process of FIG. 9 may be used to fabricate any of the packages (e.g., 100, 400, 600) described in the disclosure.

It should be noted that the sequence of FIG. 9 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 9, illustrates a state after a substrate 102 is provided. The substrate 102 includes at least one dielectric layer 320 and a plurality of interconnects 322. The substrate 102 may include a first surface (e.g., top surface) and a second surface (e.g., bottom surface). The substrate 102 may be fabricated using the method as described in FIGS. 11A-11B. In some implementations, a cored substrate is provided (e.g., substrate that includes a core layer).

Stage 2 illustrates a state after an integrated device 103 is coupled to the first surface (e.g., top surface) of the substrate 102. The integrated device 103 may be coupled to the substrate 102 through the plurality of solder interconnects 230. A solder reflow process may be used to couple the integrated device 103 to the substrate 102. The integrated device 103 includes a block 130. Stage 2 also illustrates a state after an integrated device 105 is coupled to the first surface (e.g., top surface) of the substrate 102. The integrated device 105 may be coupled to the substrate 102 through the plurality of solder interconnects 250. A solder reflow process may be used to couple the integrated device 105 to the substrate 102. The integrated device 105 includes a block 150. The integrated device 103 is configured to be electrically coupled to the integrated device 105 through the substrate 102. Examples of how the integrated device 103 and the integrated device 105 may be configured to be electrically coupled to each other are described in at least FIGS. 1-8.

Stage 3 illustrates a state after a plurality of solder interconnects 390 is coupled to the substrate 102. The plurality of solder interconnects 390 may be coupled to the second surface (e.g., bottom surface) of the substrate 102. A solder reflow process may be used to couple the plurality of solder interconnects 390 to the plurality of interconnects 322 of the substrate 102.

Figure 10:
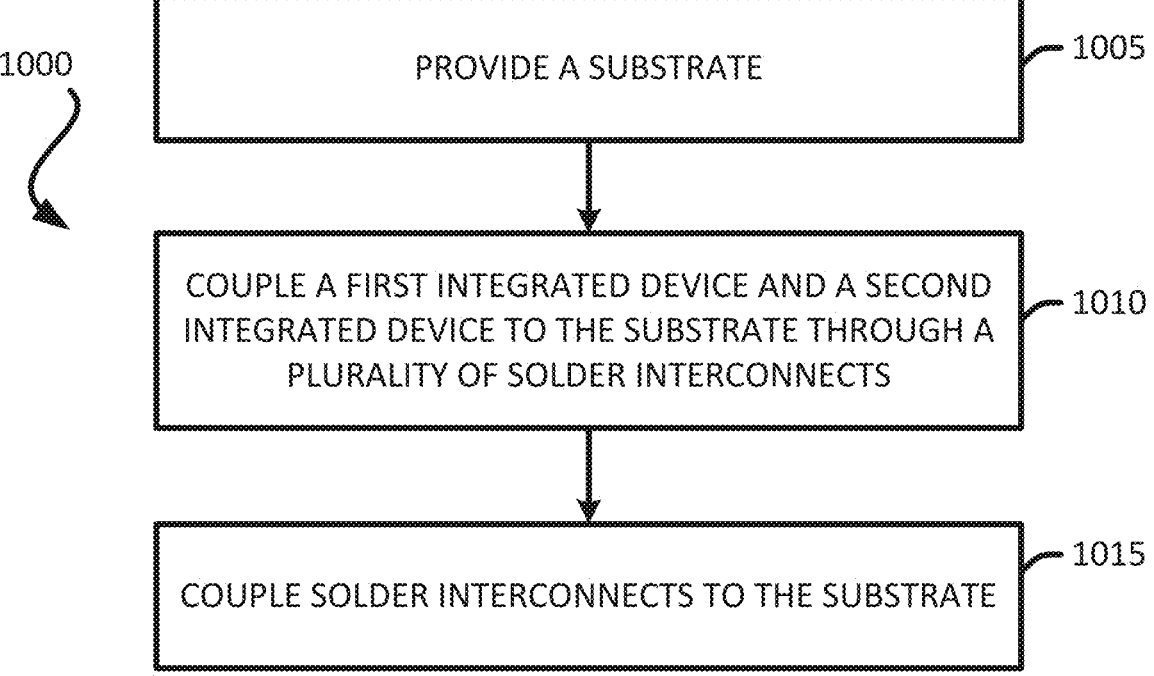
FIG. 10 illustrates an exemplary flow chart of a method for fabricating a package that includes a substrate and integrated devices.

Exemplary Flow Diagram of a Method for Fabricating a Package Comprising a Substrate and Integrated Devices In some implementations, fabricating a package includes several processes. FIG. 10 illustrates an exemplary flow diagram of a method 1000 for providing or fabricating a package. In some implementations, the method 1000 of FIG. 10 may be used to provide or fabricate the package 100 described in the disclosure. However, the method 1000 may be used to provide or fabricate any of the packages (e.g., 100, 400, 600) described in the disclosure.

It should be noted that the method 1000 of FIG. 10 may combine one or more processes in order to simplify and/or clarify the method for providing or fabricating a package. In some implementations, the order of the processes may be changed or modified.

The method provides (at 1005) a substrate (e.g., 102). The substrate 102 may be a first substrate. The substrate 102 includes at least one dielectric layer 320 and a plurality of interconnects 322. The substrate 102 may include a first surface (e.g., top surface) and a second surface (e.g., bottom surface). The substrate 102 may be fabricated using the method as described in FIGS. 11A-11B. In some implementations, a cored substrate is provided (e.g., substrate that includes a core layer). Stage 1 of FIG. 9 illustrates and describes an example of providing a substrate.

The method couples (at 1010) several integrated devices (e.g., 103, 105) to the first surface (e.g., top surface) of the substrate 102. The integrated device 103 may be coupled to the substrate 102 through the plurality of solder interconnects 230. The integrated device 103 may be coupled to the substrate 102 through a plurality of pillar interconnects and/or a plurality of solder interconnects 230. A solder reflow process may be used to couple the integrated device 103 to the substrate 102. The integrated device 103 includes a block 130. The integrated device 105 may be coupled to the substrate 102 through the plurality of solder interconnects 250. The integrated device 105 may be coupled to the substrate 102 through a plurality of pillar interconnects and/or a plurality of solder interconnects 250. A solder reflow process may be used to couple the integrated device 103 to the substrate 102. The integrated device 105 includes a block 150. The integrated device 103 is configured to be electrically coupled to the integrated device 105 through the substrate 102. Examples of how the integrated device 103 and the integrated device 105 may be configured to be electrically coupled to each other are described in at least FIGS. 1-8. Stage 2 of FIG. 9 illustrates and describes an example of coupling integrated devices to a substrate.

The method couples (at 1015) a plurality of solder interconnects (e.g., 390) to the substrate 102. A solder reflow process may be used to couple the plurality of solder interconnects 390 to the second surface of the substrate 102.

Stage 3 of FIG. 9 illustrates and describes an example of coupling solder interconnects to a substrate.

In some implementations, several packages are fabricated at the same time. In such cases, the method may singulate the package (e.g., 100, 400, 600).

Exemplary Sequence for Fabricating a Substrate

Figure 11A:
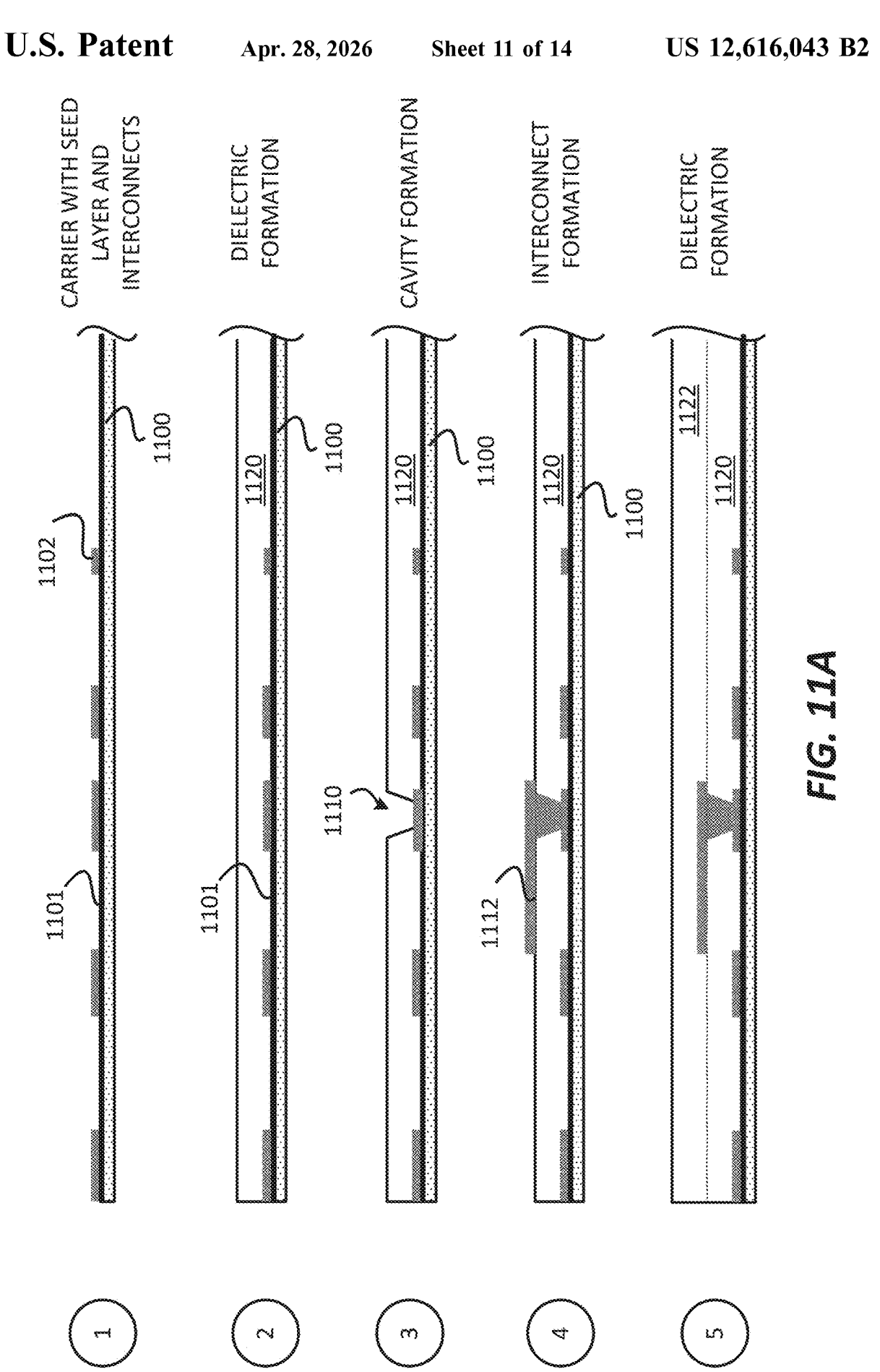
FIGS. 11A-11B illustrate an exemplary sequence for fabricating a substrate.
Figure 11B:
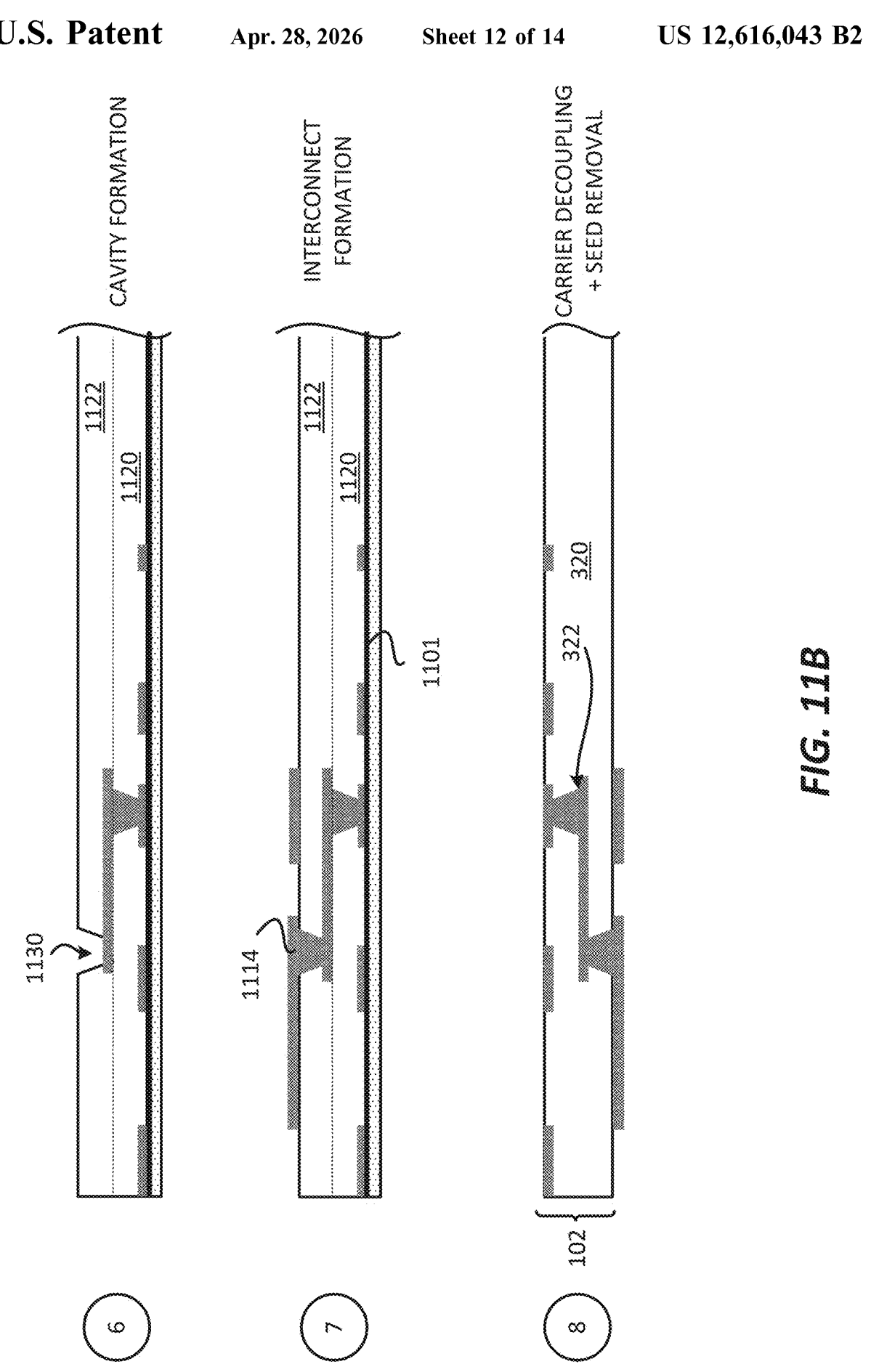

In some implementations, fabricating a substrate includes several processes. FIGS. 11A-11B illustrate an exemplary sequence for providing or fabricating a substrate. In some implementations, the sequence of FIGS. 11A-11B may be used to provide or fabricate the substrate 102. However, the process of FIGS. 11A-11B may be used to fabricate any of the substrates described in the disclosure.

It should be noted that the sequence of FIGS. 11A-11B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11A, illustrates a state after a carrier 1100 is provided. A seed layer 1101 and interconnects 1102 may be located over the carrier 1100. The interconnects 1102 may be located over the seed layer 1101. A plating process and etching process may be used to form the interconnects 1102. In some implementations, the carrier 1100 may be provided with the seed layer 1101 and a metal layer that is patterned to form the interconnects 1102. The interconnects 1102 may represent at least some of the interconnects from the plurality of interconnects 322.

Stage 2 illustrates a state after a dielectric layer 1120 is formed over the carrier 1100, the seed layer 1101 and the interconnects 1102. A deposition and/or lamination process may be used to form the dielectric layer 1120. The dielectric layer 1120 may include prepreg and/or polyimide. The dielectric layer 1120 may include a photo-imagable dielectric. However, different implementations may use different materials for the dielectric layer.

Stage 3 illustrates a state after a plurality of cavities 1110 is formed in the dielectric layer 1120. The plurality of cavities 1110 may be formed using an etching process (e.g., photo etching process) or laser process. An exposure and development process may be used to form the plurality of cavities 1110.

Stage 4 illustrates a state after interconnects 1112 are formed in and over the dielectric layer 1120, including in and over the plurality of cavities 1110. For example, vias, pads and/or traces may be formed. A plating process may be used to form the interconnects.

Stage 5 illustrates a state after a dielectric layer 1122 is formed over the dielectric layer 1120 and the interconnects 1112. A deposition and/or lamination process may be used to form the dielectric layer 1122. The dielectric layer 1122 may include prepreg and/or polyimide. The dielectric layer 1122 may include a photo-imagable dielectric. However, different implementations may use different materials for the dielectric layer.

Stage 6, as shown in FIG. 11B, illustrates a state after a plurality of cavities 1130 is formed in the dielectric layer 1122. The plurality of cavities 1130 may be formed using an etching process (e.g., photo etching process) or laser process. An exposure and development process may be used to form the plurality of cavities 1130.

Stage 7 illustrates a state after interconnects 1114 are formed in and over the dielectric layer 1122, including in and over the plurality of cavities 1130. For example, vias, pads and/or traces may be formed. A plating process may be used to form the interconnects.

Stage 8 illustrates a state after the carrier 1100 is decoupled (e.g., detached, removed, grinded out) from at least one dielectric layer 1120 and the seed layer 1101, portions of the seed layer 1101 are removed (e.g., etched out), leaving the substrate 102 that includes at least one dielectric layer 320 and the plurality of interconnects 322. The at least one dielectric layer 320 may represent the dielectric layer 1120 and/or the dielectric layer 1122. The plurality of interconnects 322 may represent the interconnects 1102, 112 and/or 1114.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

In some implementations, fabricating a substrate includes several processes. FIG. 12 illustrates an exemplary flow diagram of a method 1200 for providing or fabricating a substrate. In some implementations, the method 1200 of FIG. 12 may be used to provide or fabricate the substrate(s) of the disclosure. For example, the method 1200 of FIG. 12 may be used to fabricate the substrate 102.

It should be noted that the method 1200 of FIG. 12 may combine one or more processes in order to simplify and/or clarify the method for providing or fabricating a substrate. In some implementations, the order of the processes may be changed or modified.

The method provides (at 1205) a carrier (e.g., 1100). Different implementations may use different materials for the carrier 1100. The carrier 1100 may include a seed layer (e.g., 1101). The seed layer 1101 may include a metal (e.g., copper). The carrier may include a substrate, glass, quartz and/or carrier tape. Stage 1 of FIG. 11A illustrates and describes an example of a carrier with a seed layer that is provided.

The method forms and patterns (at 1210) interconnects over the carrier 1100 and the seed layer 1101. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 322). Stage 1 of FIG. 11A illustrates and describes an example of forming and patterning interconnects over a seed layer and a carrier.

The method forms/provides (at 1215) a dielectric layer 1120 over the seed layer 1101, the carrier 1100 and the interconnects 1102. A deposition and/or lamination process may be used to form the dielectric layer 1120. The dielectric layer 1120 may include prepreg and/or polyimide. The dielectric layer 1120 may include a photo-imagable dielectric. Forming the dielectric layer 1120 may also include forming a plurality of cavities (e.g., 1110) in the dielectric layer 1120. The plurality of cavities may be formed using an etching process (e.g., photo etching) or laser process. An exposure and development process may be used to form the plurality of cavities. Stages 2-3 of FIG. 11A illustrate and describe an example of forming a dielectric layer and cavities in the dielectric layer.

The method forms (at 1220) interconnects in and over the dielectric layer. For example, the interconnects 1112 may be formed in and over the dielectric layer 1120. A plating process may be used to form the interconnects. Forming interconnects may include providing a patterned metal layer over and/or in the dielectric layer. Forming interconnects may also include forming interconnects in cavities of the dielectric layer. Stage 4 of FIG. 11A illustrates and describes an example of forming interconnects in and over a dielectric layer.

The method forms/provides (at 1225) a dielectric layer 1122 over the dielectric layer 1120 and the interconnects 1112. A deposition and/or lamination process may be used to form the dielectric layer 1122. The dielectric layer 1122 may include prepreg and/or polyimide. The dielectric layer 1122 may include a photo-imagable dielectric. Forming the dielectric layer 1122 may also include forming a plurality of cavities (e.g., 1130) in the dielectric layer 1122. The plurality of cavities may be formed using an etching process (e.g., photo etching) or laser process. An exposure and development process may be used to form the plurality of cavities. Stages 5-6 of FIGS. 11A-11B illustrate and describe an example of forming a dielectric layer and cavities in the dielectric layer.

The method forms (at 1230) interconnects in and over the dielectric layer. For example, the interconnects 1114 may be formed in and over the dielectric layer 1122. A plating process may be used to form the interconnects. Forming interconnects may include providing a patterned metal layer over and/or in the dielectric layer. Forming interconnects may also include forming interconnects in cavities of the dielectric layer. Stage 7 of FIG. 11B illustrates and describes an example of forming interconnects in and over a dielectric layer.

The method decouples (at 1235) the carrier (e.g., 1100) from the seed layer (e.g., 1101). The carrier 1100 may be detached and/or grinded off. The method may also remove (at 1235) portions of the seed layer (e.g., 1101). An etching process may be used to remove portions of the seed layer 1101. Stage 8 of FIG. 11B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 13:
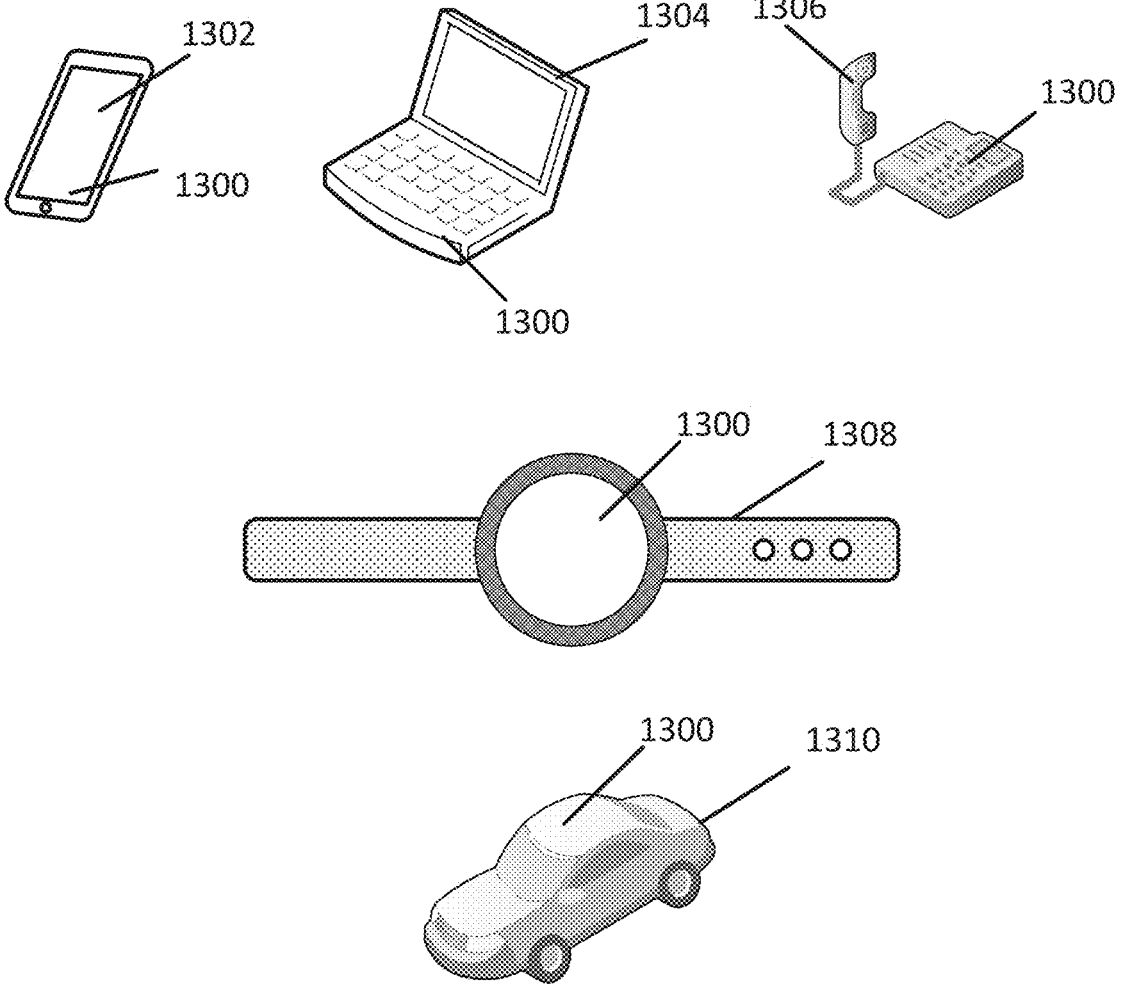
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-10, 11A-11B and 12-13 may be rearranged and/or combined into a single component, process, feature or function or embodied in several components, processes, or functions. Additional elements, components, processes, and/or functions may also be added without departing from the disclosure. It should also be noted FIGS. 1-10, 11A-11B and 12-13 and its corresponding description in the present disclosure is not limited to dies and/or ICs. In some implementations, FIGS. 1-10, 11A-11B and 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a substrate comprising at least one dielectric layer and a plurality of interconnects; a first integrated device coupled to the substrate through a first plurality of solder interconnects, wherein the first plurality of solder interconnects include a first plurality of inner solder interconnects and a first plurality of perimeter solder interconnects; and a second integrated device coupled to the substrate through a second plurality of solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects.

Aspect 2: The package of aspect 1, wherein the first plurality of inner solder interconnects include a first plurality of first inner solder interconnects and a second plurality of first inner solder interconnects, wherein the first plurality of first inner solder interconnects comprises a first spacing, wherein the second plurality of first inner solder interconnects comprises a second spacing that is greater than the first spacing, and wherein the inner solder interconnect that is part of the electrical path between the first integrated device and the second integrated device, comprises the first spacing.

3: The package of aspect 2, wherein the second plurality of first inner solder interconnects laterally surrounds the first plurality of first inner solder interconnects.

Aspect 4: The package of aspects 2 through 3, wherein the plurality of interconnects comprises a first plurality of first pad interconnects and a second plurality of first pad interconnects, wherein the first plurality of first pad interconnects comprises a first minimum spacing, wherein the second plurality of first pad interconnects comprises a second minimum spacing that is greater than the first minimum spacing, wherein the first plurality of first inner solder interconnects is coupled to the first plurality of first pad interconnects, and wherein the second plurality of first inner solder interconnects is coupled to the second plurality of first pad interconnects.

Aspect 5: The package of aspect 4, wherein the electrical path between the first integrated device and the second integrated device includes a first inner solder interconnect from the first plurality of first inner solder interconnects, a first pad interconnect from the first plurality of first pad interconnects, at least one trace interconnect from the plurality of interconnects, and the solder interconnect from the second plurality of solder interconnects.

Aspect 6: The package of aspects 1 through 5, wherein the first plurality of perimeter solder interconnects include a first plurality of first perimeter solder interconnects and a second plurality of first perimeter solder interconnects, and wherein the first plurality of first perimeter solder interconnects is configured to provide another electrical path to a third integrated device.

Aspect 7: The package of aspects 1 through 6, wherein the first integrated device includes at least one logical block comprising a plurality of transistors, and wherein the first plurality of first inner solder interconnects is located within 3 millimeters of the at least one logical block.

Aspect 8: The package of aspect 7, wherein the at least one logical block is part of a functional block of the first integrated device.

Aspect 9: The package of aspects 1 through 8, wherein the electrical path includes interconnects from the plurality of interconnects that are located below at least half of the first integrated device.

Aspect 10: The package of aspects 1 through 9, wherein the electrical path includes interconnects from the plurality of interconnects that are located along an edge of the first integrated device.

Aspect 11: A device comprising a substrate comprising at least one dielectric layer and a plurality of interconnects: a first integrated device coupled to the substrate through a first plurality of solder interconnects, wherein the first plurality of solder interconnects include a first plurality of inner solder interconnects and a first plurality of perimeter solder interconnects; and a second integrated device coupled to the substrate through a second plurality of solder interconnects, wherein the second plurality of solder interconnects include a second plurality of inner solder interconnects and a second plurality of perimeter solder interconnects. The first integrated device is configured to be electrically coupled to the second integrated device through an electrical path. The electrical path comprises an inner solder interconnect from the first plurality of inner solder interconnects, at least one interconnect from the plurality of interconnects, and a solder interconnect from the second plurality of solder interconnects.

Aspect 12: The device of aspect 11, wherein the first plurality of inner solder interconnects include a first plurality of first inner solder interconnects and a second plurality of first inner solder interconnects, wherein the first plurality of first inner solder interconnects comprises a first spacing, wherein the second plurality of first inner solder interconnects comprises a second spacing that is greater than the first spacing, and wherein the inner solder interconnect that is part of the electrical path between the first integrated device and the second integrated device, comprises the first spacing.

Aspect 13: The device of aspect 12, wherein the second plurality of first inner solder interconnects laterally surrounds the first plurality of first inner solder interconnects.

Aspect 14: The device of aspects 12 through 13, wherein the plurality of interconnects comprises a first plurality of first pad interconnects and a second plurality of first pad interconnects, a first plurality of second pad interconnects and a second plurality of second pad interconnect, wherein the first plurality of first pad interconnects comprises a first minimum spacing, wherein the second plurality of first pad interconnects comprises a second minimum spacing that is greater than the first minimum spacing, wherein the first plurality of first inner solder interconnects is coupled to the first plurality of first pad interconnects, and wherein the second plurality of first inner solder interconnects is coupled to the second plurality of first pad interconnects.

Aspect 15: The device of aspect 14, wherein the electrical path between the first integrated device and the second integrated device includes a first inner solder interconnect from the first plurality of first inner solder interconnects, a first pad interconnect from the first plurality of first pad interconnects, at least one trace interconnect from the plurality of interconnects, and the solder interconnect from the second plurality of solder interconnects.

Aspect 16: The device of aspects 14 through 15, wherein the second plurality of inner solder interconnects include a first plurality of second inner solder interconnects and a second plurality of second inner solder interconnects, wherein the first plurality of second inner solder interconnects is coupled to the first plurality of second pad interconnects, and wherein the second plurality of second inner solder interconnects is coupled to the second plurality of second pad interconnects.

Aspect 17: The device of aspects 11 through 16, wherein the first plurality of perimeter solder interconnects include a first plurality of first perimeter solder interconnects and a second plurality of first perimeter solder interconnects, and wherein the first plurality of first perimeter solder interconnects is configured to provide another electrical path to a third integrated device.

Aspect 18: The device of aspects 11 through 17, wherein the first integrated device includes at least one logical block comprising a plurality of transistors, wherein the at least one logical block is part of a functional block of the first integrated device, and wherein the first plurality of first inner solder interconnects is located within 3 millimeters of the at least one logical block.

Aspect 19: The device of aspects 11 through 18, wherein the electrical path includes interconnects from the plurality of interconnects that are located below at least half of the first integrated device.

Aspect 20: The device of aspects 11 through 19, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising at least one dielectric layer and a plurality of interconnects;
a first integrated device comprising a first inner portion and a first perimeter portion that laterally surrounds the first inner portion,
   wherein the first integrated device comprises at least one logical block comprising a plurality of transistors,
   wherein the at least one logical block vertically overlaps with the first inner portion,
   wherein the first integrated device is coupled to the substrate through a first plurality of solder interconnects, wherein the first plurality of solder interconnects include a first plurality of inner solder interconnects and a first plurality of perimeter solder interconnects; and
a second integrated device comprising a second inner portion and a second perimeter portion that laterally surrounds the second inner portion,
   wherein the second integrated device is coupled to the substrate through a second plurality of solder interconnects,
   wherein the first integrated device is configured to be electrically coupled to the second integrated device through an electrical path,
wherein the electrical path is for input/output signals between the first integrated device and the second integrated device,
wherein the first plurality of inner solder interconnects include a first plurality of first inner solder interconnects and a second plurality of first inner solder interconnects, wherein the first plurality of inner solder interconnects vertically overlap with the first inner portion of the first integrated device, wherein adjacent first inner solder interconnects from the first plurality of first inner solder interconnects comprise a first spacing, wherein adjacent first inner solder interconnects from the second plurality of first inner solder interconnects comprise a second spacing that is greater than the first spacing, wherein the second plurality of first inner solder interconnects laterally surround the first plurality of first inner solder interconnects, wherein the electrical path between the first integrated device and the second integrated device comprises a first inner solder interconnect from the first plurality of first inner solder interconnects, at least one interconnect from the plurality of interconnects of the substrate, and a solder interconnect from the second plurality of solder interconnects.

2. The package of claim 1, wherein the second plurality of first inner solder interconnects vertically overlap with the first inner portion of the first integrated device.

3. The package of claim 2, wherein the second plurality of first inner solder interconnects collectively as a group of solder interconnects, laterally surrounds the first plurality of first inner solder interconnects.

4. The package of claim 2, wherein the plurality of interconnects comprise a first plurality of first pad interconnects and a second plurality of first pad interconnects, wherein adjacent pad interconnects from the first plurality of first pad interconnects comprise a first minimum spacing, wherein adjacent pad interconnects from the second plurality of first pad interconnects comprise a second minimum spacing that is greater than the first minimum spacing, wherein the first plurality of first inner solder interconnects are coupled to the first plurality of first pad interconnects, and wherein the second plurality of first inner solder interconnects are coupled to the second plurality of first pad interconnects.

5. The package of claim 4, wherein the electrical path between the first integrated device and the second integrated device includes the first inner solder interconnect from the first plurality of first inner solder interconnects, a first pad interconnect from the first plurality of first pad interconnects, at least one trace interconnect from the plurality of interconnects, and the solder interconnect from the second plurality of solder interconnects.

6. The package of claim 1, wherein the first plurality of perimeter solder interconnects include a first plurality of first perimeter solder interconnects and a second plurality of first perimeter solder interconnects, and wherein the first plurality of first perimeter solder interconnects are configured to provide another electrical path to a third integrated device.

7. The package of claim 1, wherein the first plurality of first inner solder interconnects are located within 3 millimeters of the at least one logical block.

8. The package of claim 7, wherein the at least one logical block is part of a functional block of the first integrated device.

9. The package of claim 1, wherein the electrical path includes interconnects from the plurality of interconnects that vertically overlaps with at least half of the first integrated device.

10. The package of claim 1, wherein the electrical path includes interconnects from the plurality of interconnects that are located along an edge of the first integrated device.

* * * * *